United States Patent
Song et al.

(10) Patent No.: US 11,164,651 B2
(45) Date of Patent: Nov. 2, 2021

(54) SEMICONDUCTOR DEVICES AND SEMICONDUCTOR SYSTEMS INCLUDING THE SAME

(71) Applicant: SK hynix Inc., Icheon-si (KR)

(72) Inventors: Choung Ki Song, Yongin-si (KR); Jung Ho Lim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/846,042

(22) Filed: Apr. 10, 2020

(65) Prior Publication Data

US 2021/0142860 A1 May 13, 2021

(30) Foreign Application Priority Data

Nov. 7, 2019 (KR) .................. 10-2019-0142088

(51) Int. Cl.
| | |
|---|---|
| *G11C 29/00* | (2006.01) |
| *G11C 29/42* | (2006.01) |
| *G11C 29/44* | (2006.01) |
| *G11C 7/06* | (2006.01) |
| *G11C 7/12* | (2006.01) |
| *G11C 29/20* | (2006.01) |
| *G11C 29/18* | (2006.01) |

(52) U.S. Cl.
CPC .............. *G11C 29/42* (2013.01); *G11C 7/065* (2013.01); *G11C 7/12* (2013.01); *G11C 29/20* (2013.01); *G11C 29/44* (2013.01); *G11C 2029/1802* (2013.01)

(58) Field of Classification Search
CPC ........... G11C 29/42; G11C 7/065; G11C 7/12; G11C 29/20; G11C 29/44; G11C 2029/1802
See application file for complete search history.

(56) References Cited

U.S. PATENT DOCUMENTS

| | | | |
|---|---|---|---|
| 6,560,725 B1 | 5/2003 | Longwell et al. | |
| 7,143,329 B1 | 11/2006 | Trimberger et al. | |
| 8,588,017 B2 | 11/2013 | Park et al. | |
| 10,613,928 B2* | 4/2020 | Kim | ...................... G06F 11/106 |
| 10,817,371 B2 | 10/2020 | Rooney et al. | |
| 10,922,170 B2* | 2/2021 | Kim | ........................ G11C 5/04 |
| 2002/0051397 A1 | 5/2002 | Watanabe et al. | |
| 2004/0243886 A1 | 12/2004 | Klein | |
| 2006/0117155 A1 | 6/2006 | Ware et al. | |
| 2006/0285412 A1 | 12/2006 | Hummler | |
| 2007/0038919 A1 | 2/2007 | Sekiguchi et al. | |

(Continued)

FOREIGN PATENT DOCUMENTS

| | | |
|---|---|---|
| KR | 100667784 B1 | 1/2007 |
| KR | 1020170056823 A | 5/2017 |
| KR | 1020190063123 A | 6/2019 |

*Primary Examiner* — Pho M Luu
(74) *Attorney, Agent, or Firm* — William Park & Associates Ltd.

(57) ABSTRACT

A semiconductor device includes an error check and scrub (ECS) command generation circuit and an ECS control circuit. The ECS command generation circuit generates an ECS command based on a refresh command. During an ECS operation, the ECS control circuit generates an ECS mode signal that is activated based on the ECS command and generates an ECS active command, an ECS read command, and an ECS write command to continue the ECS operation.

21 Claims, 16 Drawing Sheets

(56) References Cited

U.S. PATENT DOCUMENTS

| | | |
|---|---|---|
| 2008/0092016 A1 | 4/2008 | Pawlowski |
| 2008/0109705 A1 | 5/2008 | Pawlowski et al. |
| 2011/0126073 A1 | 5/2011 | Nieuwland et al. |
| 2014/0068319 A1 | 3/2014 | Daly |
| 2016/0026533 A1* | 1/2016 | Ishikawa ............... G11C 11/406 714/6.2 |
| 2017/0060681 A1 | 3/2017 | Halbert et al. |
| 2017/0161143 A1 | 6/2017 | Reed et al. |
| 2018/0150350 A1 | 5/2018 | Cha et al. |
| 2019/0179560 A1 | 6/2019 | Moon et al. |

\* cited by examiner

FIG.7

| Data Rate (Mbps) | tCCD (nck) | tDLLK (nck) |
|---|---|---|
| 2000 ~ 3200 | 8 | 1024 |
| 3201 ~ 3600 | 9 | 1024 |
| 3601 ~ 4000 | 10 | 1280 |
| 4001 ~ 4400 | 11 | 1280 |
| 4401 ~ 4800 | 12 | 1536 |
| 4801 ~ 3200 | 13 | 1536 | they
SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C. 119(a) to Korean Application No. 10-2019-0142088, filed on Nov. 7, 2019, which is incorporated herein by reference in its entirety.

BACKGROUND

1. Technical Field

Embodiments of the present disclosure relate to semiconductor devices and semiconductor systems including the same, and more particularly, to semiconductor devices correcting errors of memory cells and semiconductor systems including the same.

2. Related Art

Recently, a DDR2 scheme or a DDR3 scheme, receiving and outputting four-bit data or eight-bit data during each clock cycle time, has been used to improve the operation speed of semiconductor devices. If the data transmission speed of the semiconductor devices becomes faster, the probability of errors occurring may increase while data is transmitted in the semiconductor devices. Accordingly, advanced design schemes have been proposed to guarantee the reliability of data transmission.

Whenever data is transmitted in semiconductor devices, an error check code that is capable of detecting the occurrence of errors may be generated and transmitted with the data to guarantee the reliability of data transmission. The error check code may include an error detection code (EDC) that is capable of detecting errors and an error correction code (ECC) that is capable of correcting the errors by itself.

SUMMARY

According to an embodiment, a semiconductor device includes an error check and scrub (ECS) command generation circuit and an ECS control circuit. The ECS command generation circuit generates an ECS command based on a refresh command. During an ECS operation, the ECS control circuit generates an ECS mode signal that is activated based on the ECS command and generates an ECS active command, an ECS read command, and an ECS write command to continue the ECS operation.

According to another embodiment, a semiconductor device includes a command/address receiving circuit, a command decoder, an error check and scrub (ECS) command generation circuit, and an ECS control circuit. The command/address receiving circuit is configured to buffer a command/address signal to generate an internal command/address signal. The command decoder is configured to decode the internal command/address signal to generate a refresh command. The ECS command generation circuit is configured to generate an ECS command based on the refresh command. The ECS control circuit is configured to generate an ECS mode signal that is activated based on the ECS command during an ECS operation. The command/address receiving circuit is deactivated when the ECS operation is performed.

According to yet another embodiment, a semiconductor system includes controller and a semiconductor device. The controller is configured to output a command and an address and is configured to receive an error log signal and an error log address. The semiconductor device is configured to generate an error check and scrub (ECS) command based on a refresh command that is generated by decoding the command, configured to detect an error of a codeword, including data and parity, stored in memory cells, to generate an error flag based on the ECS command during an ECS operation, configured to store information regarding a maximum number of errors of a row path as the error log signal based on the error flag, configured to store information regarding the row path with the maximum number of errors as the error log address, and configured to output the error log signal and the error log address.

BRIEF DESCRIPTION OF THE DRAWINGS

FIG. 7 is a table, illustrating speed flags used in the ECS control circuit of FIG. 6.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level that is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
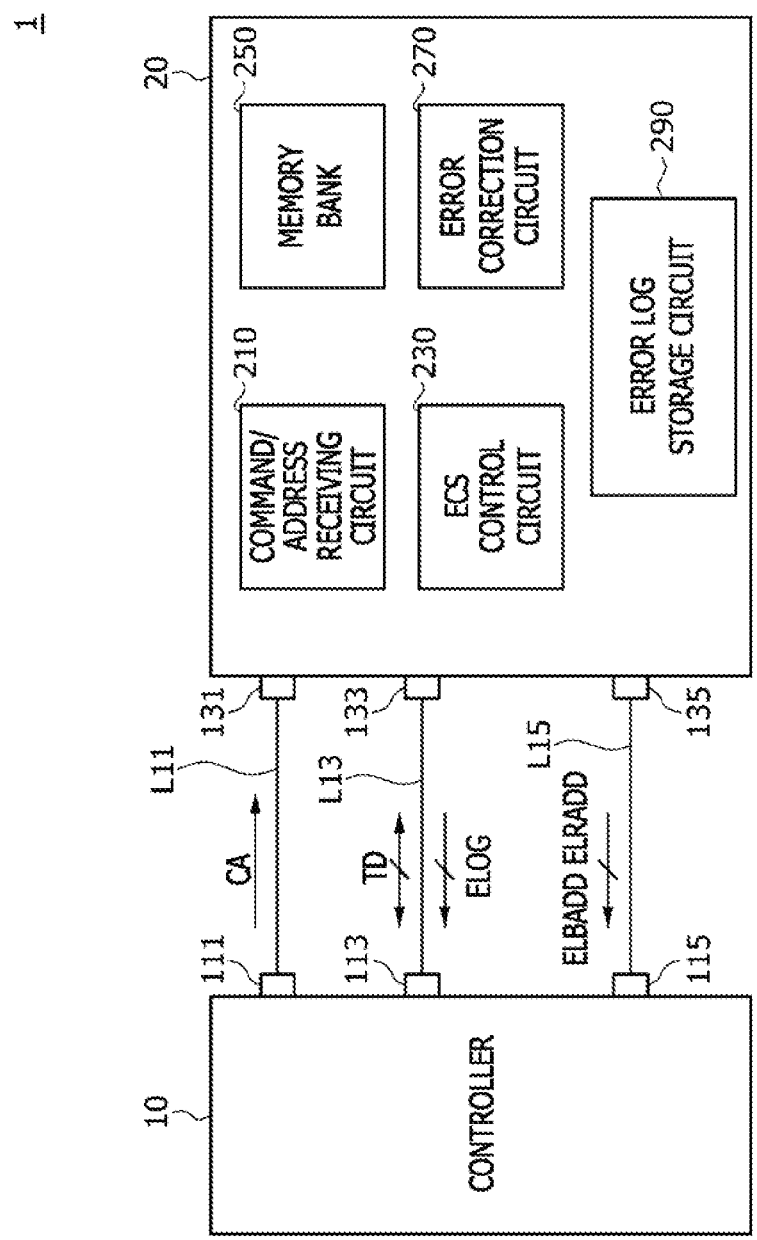
FIG. 1 is a block diagram, illustrating a configuration of a semiconductor system, according to an embodiment of the present disclosure.

In the embodiment, as illustrated in FIG. 1, a semiconductor system 1 may include a controller 10 and a semiconductor device 20. The semiconductor device 20 may include a command/address receiving circuit 210, an error check and scrub (ECS) control circuit 230, a memory bank 250, an error correction circuit 270, and an error log storage circuit 290.

The controller 10 may include a first control pin 111, a second control pin 113, and a third control pin 115. The semiconductor device 20 may include a first semiconductor pin 131, a second semiconductor pin 133, and a third semiconductor pin 135. The first control pin 111 may be connected to the first semiconductor pin 131 through a first transmission line L11. The second control pin 113 may be connected to the second semiconductor pin 133 through a second transmission line L13. The third control pin 115 may be connected to the third semiconductor pin 135 through a third transmission line L15. The controller 10 may transmit a command/address signal CA to the semiconductor device 20 through the first transmission line L11 in order to control the semiconductor device 20. The controller 10 may receive transmission data TD from the semiconductor device 20 through the second transmission line L13 or may output transmission data TD to the semiconductor device 20 through the second transmission line L13. The semiconductor device 20 may transmit an error log signal ELOG to the controller 10 through the second transmission line L13. The semiconductor device 20 may transmit an error log bank address ELBADD and an error log row address ELRADD to the controller 10 through the third transmission line L15. The configuration and operation of the controller 10 will be described in more detail with reference to FIG. 14.

The command/address receiving circuit 210 may receive the command/address signal CA to execute various internal operations through the first transmission line L11. The various internal operations may include a read operation, a write operation, and a refresh operation. The command/address signal CA may include a command and an address. When an ECS operation is performed, the command/address receiving circuit 210 may be deactivated to stop an operation that receives the command/address signal CA. In the present embodiment, the ECS operation may be automatically performed when a refresh command has a value that is equal to or greater than a predetermined value. Because the command/address receiving circuit 210 is deactivated during the ECS operation, it may be possible to reduce the power consumption of the semiconductor device 20 and to prevent a malfunction of the semiconductor device 20 from occurring due to the command/address signal CA being inputted to the command/address receiving circuit 210.

The ECS control circuit 230 may control the ECS operation based on the refresh command. The ECS operation may include an ECS read operation, an ECS error correction operation, and an ECS write operation. The ECS control circuit 230 may control the memory bank 250 and the error correction circuit 270 such that a codeword, outputted from the memory bank 250, is transmitted to the error correction circuit 270 when the ECS read operation is performed. The codeword may include data and parity. Parity may be generated from the data using an error correction code (ECC). When the ECS error correction operation is performed, the ECS control circuit 230 may control the error correction circuit 270 such that the error correction circuit 270 checks an error of the codeword, outputted from the memory bank 250, and corrects the error of the codeword to generate a corrected codeword. When the corrected codeword is generated during the ECS error correction operation, the ECS control circuit 230 may control the memory bank 250 and the error correction circuit 270 such that the corrected codeword is stored in the memory bank 250 through the ECS write operation. When the corrected codeword is not generated during the ECS error correction operation, the ECS write operation is not performed. The ECS control circuit 230 may control the error log storage circuit 290 such that the error log storage circuit 290 stores information on the number of the errors after the ECS operations of all of the memory cells included in the memory bank 250 are performed. When the ECS operations of all of the memory cells included in the memory bank 250 are performed, the ECS control circuit 230 may control the error log storage circuit 290 to compare the number of errors of all of row paths with each other and to store information on the maximum number of errors and information on a row path with the maximum number of errors. The row path may mean at least one word line, that is activated during an active operation, among a plurality of word lines connected to the memory cells included in the memory bank 250.

The memory bank 250 may include a plurality of memory cells, and at least one of the plurality of memory cells may be selected by an address during a read operation, a ECS read operation, a write operation, a ECS write operation, and a refresh operation. When the read operation is performed, the memory bank 250 may output the data included in a codeword, stored in the memory cells that are selected by an address as the transmission data TD, through the second transmission line L13. When the ECS read operation is performed, the memory bank 250 may output the codeword, stored in the memory cells that are selected by an address to the error correction circuit 270. The number of bits included in the data included in a codeword outputted from the memory bank 250 during the read operation and the ECS read operation may be set based on a burst length. When the write operation is performed, the memory bank 250 may store a codeword into memory cells that are selected by the address. When the ECS write operation is performed, the memory bank 250 may store a corrected codeword, generated by the error correction circuit 270, into memory cells that are selected by the address. The number of bits included in data or corrected data included in the codeword stored in the memory bank 250 during the write operation and the ECS write operation may be set based on a burst length. When the refresh operation is performed, the memory bank 250 may periodically restore the data of memory cells that are selected by an address.

When the read operation or the ECS read operation is performed, the error correction circuit 270 may receive a codeword, including data and parity, which are stored in memory cells that are selected by an address, to detect an error of the codeword. The error correction circuit 270 may correct an error of the codeword to generate a corrected codeword when the error is detected from the codeword that is inputted to the error correction circuit 270 during the read operation or the ECS read operation. When the error of the codeword is detected during the ECS read operation, the error correction circuit 270 may generate an error flag (EFLAG of FIG. 2) to transmit the error flag EFLAG to the error log storage circuit 290. When the ECS write operation is performed, the error correction circuit 270 may store the corrected codeword into memory cells that are selected by an address. When the write operation is performed, the error correction circuit 270 may transmit the corrected codeword to the controller 10.

The error log storage circuit 290 may extract and store information on the numbers of the errors of the row paths, information on the maximum number of the errors, and information on a row path with the maximum number of the errors based on the error flag EFLAG when the ECS operations of all of the memory cells included in the memory bank 250 are sequentially performed. The error log storage circuit 290 may transmit the information on the numbers of the errors of the row paths, the information on the maximum number of the errors, and the information on a row path with the maximum number of the errors to the controller 10 through the second and third transmission lines L13 and L15 when an error log command (ELC of FIG. 2) is generated.

Figure 2:
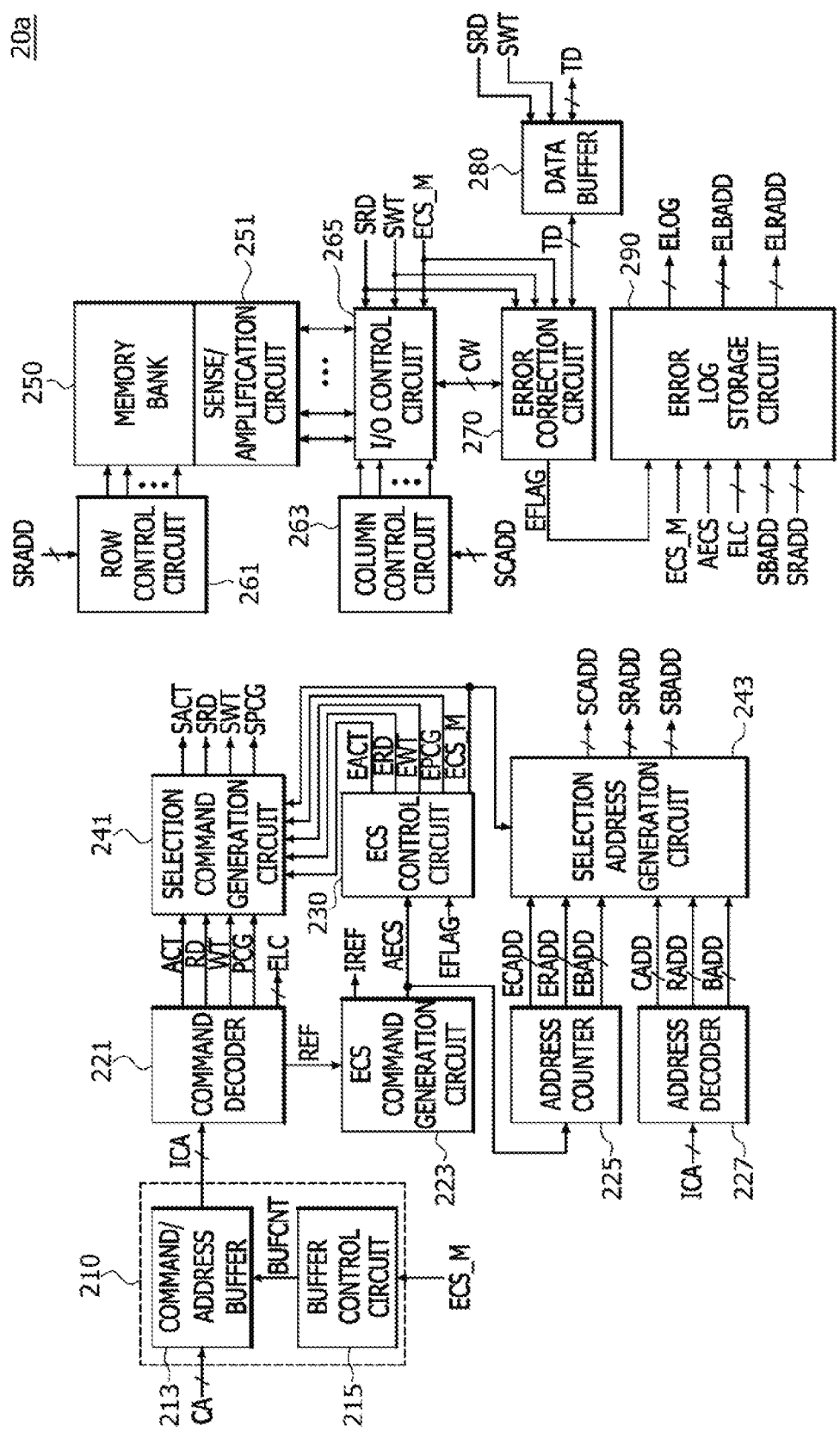
FIG. 2 is a block diagram, illustrating an example of a semiconductor device, included in the semiconductor system of FIG. 1.

FIG. 2 is a block diagram, illustrating a configuration of a semiconductor device 20a, corresponding to an example of the semiconductor device 20, included in the semiconductor system 1. The semiconductor device 20a may include the command/address receiving circuit 210, a command decoder 221, an ECS command generation circuit 223, an address counter 225, an address decoder 227, the ECS control circuit 230, a selection command generation circuit 241, a selection address generation circuit 243, the memory bank 250, a sense/amplification circuit 251, a row control circuit 261, a column control circuit 263, an I/O control circuit 265, the error correction circuit 270, a data buffer 280, and the error log storage circuit 290.

The command/address receiving circuit 210 may include a command/address buffer 213 and a buffer control circuit 215. The command/address buffer 213 may buffer the command/address signal CA received through the first transmission line L11 to generate an internal command/address signal ICA. When the ECS operation is performed, the buffer control circuit 215 may generate a buffer control signal BUFCNT based on an ECS mode signal ECS_M. When the ECS operation is performed, the command/address buffer 213 may receive the buffer control signal BUFCNT generated by the buffer control circuit 215 and may buffer the command/address signal CA to stop an operation for generating the internal command/address signal ICA. The number of bits included in the command/address signal CA and the internal command/address signal ICA may be set to be different according to the embodiments.

The command decoder 221 may decode the internal command/address signal ICA to generate a refresh command REF, an active command ACT, a read command RD, a write command WT, a pre-charge command PCG, and the error log command ELC. The refresh command REF may be generated to perform the refresh operation. The active command ACT may be generated to perform the active operation. The read command RD may be generated to perform the read operation. The write command WT may be generated to perform the write operation. The pre-charge command PCG may be generated to perform a pre-charge operation. The error log command ELC may be generated to store the number of memory cells storing a codeword including an error based on the error flag EFLAG and may be generated to store a selection bank address SBADD and a selection row address SRADD for selecting a row path with the maximum number of errors.

The ECS command generation circuit 223 may generate an ECS command AECS and an internal refresh command IREF based on the refresh command REF. The ECS command generation circuit 223 may generate the ECS command AECS whenever the refresh command REF is generated a predetermined number of times. When the ECS command AECS is not generated, the ECS command generation circuit 223 may generate the internal refresh command IREF based on the refresh command REF. For example, when the predetermined set value is a natural number 'K' that is equal to or more than two, the ECS command generation circuit 223 may generate the internal refresh command IREF until the refresh command REF is generated 'K-1' times and may generate the ECS command AECS when the refresh command REF is generated 'K' times. A configuration and an operation of the ECS command generation circuit 223 will be described in more detail with reference to FIGS. 3 and 4.

The address counter 225 may generate an ECS column address ECADD, an ECS row address ERADD, and an ECS bank address EBADD based on the ECS command AECS. The address counter 225 may count the ECS command AECS to control a logic level combination of the ECS column address ECADD, a logic level combination of the ECS row address ERADD, and a logic level combination of the ECS bank address EBADD. The number of bits included in each of the ECS column address ECADD, the ECS row address ERADD, and the ECS bank address EBADD may be set to be different according to the embodiments. The address counter 225 may count the ECS command AECS to sequentially increase a binary number corresponding to a logic level combination of bits included in the ECS column address ECADD, to sequentially increase a binary number corresponding to a logic level combination of bits included in the ECS row address ERADD, and to sequentially increase a binary number corresponding to a logic level combination of bits included in the ECS bank address EBADD. When each of the ECS column address ECADD, the ECS row address ERADD, and the ECS bank address EBADD includes two bits, the sequential increase of the logic level combination of each of the ECS column address ECADD, the ECS row address ERADD, and the ECS bank address EBADD may mean that the logic level combination of each of the ECS column address ECADD, the ECS row address ERADD, and the ECS bank address EBADD changes in order of '00', '01', '10', and '11. A configuration and an operation of the address counter 225 will be described in more detail with reference to FIG. 8.

The address decoder 227 may decode the internal command/address signal ICA to generate a column address CADD, a row address RADD, and a bank address BADD. The address decoder 227 may decode the internal command/address signal ICA to generate the column address CADD, the row address RADD, and the bank address BADD used for the internal operations including the active operation, the read operation, and the write operation.

The ECS control circuit 230 may generate the ECS mode signal ECS_M based on the ECS command AECS. The ECS mode signal ECS_M may be generated during the ECS operation. The ECS control circuit 230 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 230 may count an internal clock signal (ICLK of FIG. 5) based on the error flag EFLAG to sequentially generate the ECS active command EACT, the ECS read command ERD, the ECS write command EWT, and the ECS pre-charge command EPCG while the ECS operation is performed. For example, the ECS control circuit 230 may generate the ECS active command EACT when the internal clock signal ICLK, generated by the ECS command AECS, is counted three times. Furthermore, the ECS control circuit 230 may generate the ECS read command ERD when the internal clock signal ICLK is counted five times, may generate the ECS write command EWT when the internal clock signal ICLK is counted seven times, and may generate the ECS pre-charge command EPCG when the internal clock signal ICLK is counted nine times. The number of times that the internal clock signal ICLK is counted to generate each of the ECS active command EACT, the ECS read command ERD, the ECS write command EWT, and the ECS pre-charge command EPCG may be set to be different according to the embodiments. When no error is detected from a codeword outputted from the memory cells during the ECS error correction operation, the error flag EFLAG is not generated, and the ECS control circuit 230 might not generate the ECS write command EWT. The configuration and operation of the ECS control circuit 230 will be described in more detail with reference to FIGS. 5 to 7.

The selection command generation circuit 241 may generate a selection active command SACT, a selection read command SRD, a selection write command SWT, and a selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. While the ECS operation is being performed, the selection command generation circuit 241 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG. While the ECS operation is not being performed, the selection command generation circuit 241 may select and output the active command ACT, the read command RD, the write command WT, and the pre-charge command PCG as the selection active command SACT, the selection read command SRD, the selection write command SWT, and the selection pre-charge command SPCG. The configuration and operation of the selection command generation circuit 241 will be described in more detail with reference to FIG. 9.

The selection address generation circuit 243 may generate a selection column address SCADD, a selection row address SRADD, and a selection bank address SBADD from the ECS column address ECADD, the ECS row address ERADD, the ECS bank address EBADD, the column address CADD, the row address RADD, and the bank address BADD based on the ECS mode signal ECS_M. While the ECS operation is being performed, the selection address generation circuit 243 may select and output the ECS column address ECADD, the ECS row address ERADD, and the ECS bank address EBADD as the selection column address SCADD, the selection row address SRADD, and the selection bank address SBADD while the ECS operation is performed. While the ECS operation is not being performed, the selection address generation circuit 243 may select and output the column address CADD, the row address RADD, and the bank address BADD as the selection column address SCADD, the selection row address SRADD, and the selection bank address SBADD. The configuration and operation of the selection address generation circuit 243 will be described in more detail with reference to FIG. 10.

The memory bank 250 may include a plurality of memory cells, and each of the memory cells may be coupled to any one of word lines and any one of bit lines. One of the word lines that is connected to the memory cells, included in the memory bank 250, may be selected by the selection row address SRADD. At least one of the bit lines that is connected to the memory cells, included in the memory bank 250, may be selected by the selection column address SCADD. At least one of the memory cells may be accessed by selecting one of the word lines and at least one of the bit lines. The number of the word lines that are coupled to the memory cells, included in the memory bank 250, and the number of the bit lines that are coupled to the memory cells, included in the memory bank 250, may be set to be different depending on the embodiment. The configuration and operation of the memory bank 250 will be described in more detail with reference to FIG. 11. Although the present embodiment describes a case in which the ECS operation is performed on memory cells that are only in the memory bank 250 based on the selection bank address SBADD, the present disclosure is not limited thereto. For example, in other embodiments, the semiconductor device 20a may include an ECS operation that is performed on memory cells that are included in one of a plurality of memory banks based on the selection bank address SBADD.

The sense/amplification circuit 251 may include a plurality of sense amplifiers (not shown). The sense amplifiers, included in the sense/amplification circuit 251, may be connected to the memory cells, included in the memory bank 250, and may sense and amplify the levels of the data signals that are loaded on the bit lines.

The row control circuit 261 may select one of the word lines, coupled to the memory cells that are included in the memory bank 250, as the row path based on the selection row address SRADD. The row control circuit 261 may perform the active operation to load a codeword, stored in the memory cells in a row path that is selected by the selection row address SRADD, on the bit lines such that the sense/amplification circuit 251 senses and amplifies data signals of the codeword.

The column control circuit 263 may control the I/O control circuit 265 such that the codeword is inputted to or outputted from the sense amplifiers, selected by the selection column address SCADD, among the plurality of sense amplifiers that are coupled to the memory cells in the row path. The column control circuit 263 may control the I/O control circuit 265 such that the read operation and the write operation are performed for the memory cells that are coupled to the sense amplifiers, selected by the selection column address SCADD, among the plurality of memory cells that are included in a memory bank performing the active operation.

The I/O control circuit 265 may be coupled between the sense/amplification circuit 251 and the error correction circuit 270 to control input or output a codeword based on the selection read command SRD, the selection write command SWT, and the ECS mode signal ECS_M. The I/O control circuit 265 may output a codeword CW, including data and parity, outputted from the memory bank 250 to the error correction circuit 270 during the read operation or the ECS read operation. The I/O control circuit 265 may output the codeword CW, received from the error correction circuit 270, to the memory bank 250 during the write operation or the ECS write operation.

The error correction circuit 270 may receive the codeword CW from the I/O control circuit 265 or may output the codeword CW to the I/O control circuit 265 based on the selection read command SRD, the selection write command SWT, and the ECS mode signal ECS_M. The error correction circuit 270 may receive the transmission data TD from the data buffer 280 or may output the transmission data TD to the data buffer 280 based on the selection read command SRD, the selection write command SWT, and the ECS mode signal ECS_M. The error correction circuit 270 may generate the error flag EFLAG based on the codeword CW. When the read operation is performed, the error correction circuit 270 may receive the codeword CW from the I/O control circuit 265 and may decode the codeword CW to generate the error flag EFLAG and to output data, included in the codeword CW, corrected by the error correction circuit 270, as the transmission data TD through the data buffer 280 if an error is detected from the codeword CW. When the write operation is performed, the error correction circuit 270 may encode the transmission data TD that is received from the data buffer 280 to generate the codeword CW, including data and parity, and may transmit the codeword CW to the I/O control circuit 265 to store the codeword CW into the memory bank 250. When the ECS read operation is performed, the error correction circuit 270 may receive the codeword CW from the I/O control circuit 265 and may decode the codeword CW to generate the error flag EFLAG and the codeword CW that are corrected by the error correction circuit 270 if an error is detected from the codeword CW. The error correction circuit 270 may generate the corrected codeword CW during the ECS read operation, and the error correction circuit 270 may transmit the corrected codeword CW to the I/O control circuit 265 to store the corrected codeword CW into the memory bank 250 during the ECS write operation. The configuration and operation of the error correction circuit 270 will be described in more detail with reference to FIG. 12.

The data buffer 280 may receive the transmission data TD from the error correction circuit 270 or may output the transmission data TD to the error correction circuit 270 based on the selection read command SRD and the selection write command SWT. The data buffer 280 may receive the transmission data TD from the controller (10 of FIG. 1) or may output the transmission data TD to the controller (10 of FIG. 1) based on the selection read command SRD and the selection write command SWT. When the write operation is performed, the data buffer 280 may transmit the transmission data TD, received through the second transmission line (L13 of FIG. 1), to the error correction circuit 270. When the read operation is performed, the data buffer 280 may transmit the transmission data TD, received from the error correction circuit 270, to the controller 10 through the second transmission line L13.

The error log storage circuit 290 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. When the ECS operations are performed for all of the memory cells included in the memory bank 250, the error log storage circuit 290 may output information on the number of errors detected based on the error flag EFLAG as the error log signal ELOG. When the ECS operations are performed for all of the memory cells that are included in the memory bank 250, the error log storage circuit 290 may compare the numbers of the errors of all of the row paths with each other based on the error flag EFLAG, the selection row address SRADD, and the selection bank address SBADD. The error log storage circuit 290 may compare the numbers of the errors of all of the row paths to output the error log signal ELOG, information regarding the maximum number of the errors, and the error log row address ELRADD and the error log bank address ELBADD, information regarding the row path with the maximum number of the errors. The error log storage circuit 290 may transmit the error log signal ELOG to the controller 10 through the second transmission line L13. The error log storage circuit 290 may transmit the error log row address ELRADD and the error log bank address ELBADD to the controller 10 through the third transmission line L15. The configuration and operation of the error log storage circuit 290 will be described in more detail with reference to FIG. 13.

Figure 3:
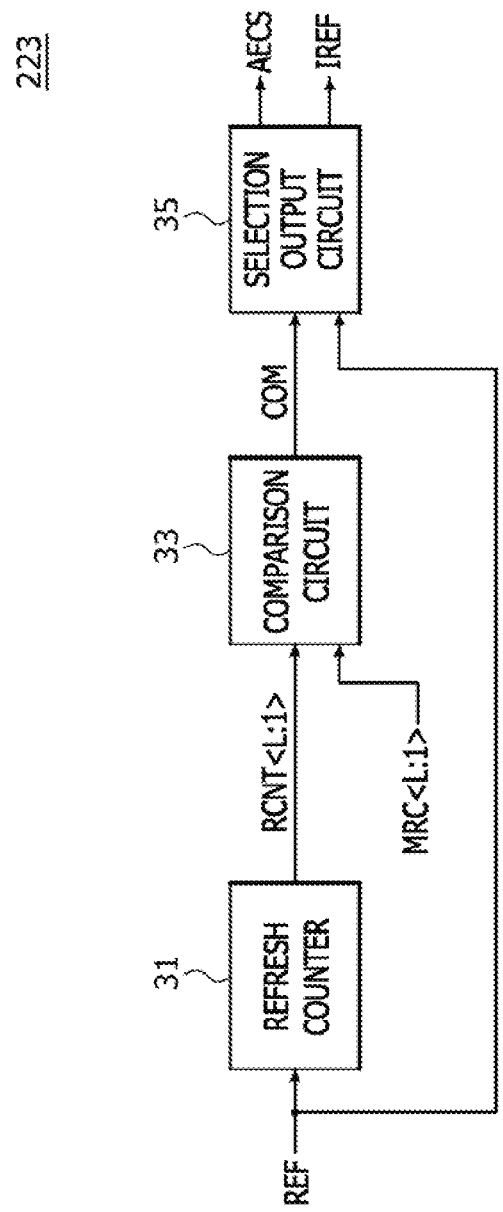
FIG. 3 is a block diagram, illustrating an example of an error check and scrub (ECS) command generation circuit, included in the semiconductor device of FIG. 2.

FIG. 3 is a block diagram, illustrating an ECS command generation circuit 223, included in the semiconductor device 20a. As illustrated in FIG. 3, the ECS command generation circuit 223 may include a refresh counter 31, a comparison circuit 33, and a selection output circuit 35.

The refresh counter 31 may count the refresh command REF to generate a refresh count signal RCNT<L:1>. The refresh counter 31 may increase the logic level combination of bits, included in the refresh count signal RCNT<L:1>, whenever the refresh command REF is inputted into the refresh counter 31. The number "L" of bits that are included in the refresh count signal RCNT<L:1> may be set as a natural number that is equal to or greater than two. For example, when the number "L" is set to be two, the logic level combination of the refresh count signal RCNT<L:1> may sequentially increase in order ('00', '01', '10', and '11') whenever the refresh command REF is inputted into the refresh counter 31. With regard to the refresh count signal RCNT<2:1> having two bits, the logic level combination of '01' means that the second bit RCNT<2> of the refresh count signal RCNT<2:1> has a logic "low" level and the first bit RCNT<1> of the refresh count signal RCNT<2:1> has a logic "high" level.

The comparison circuit 33 may compare the refresh count signal RCNT<L:1> with a set signal MRC<L:1> to generate a comparison signal COM. The comparison circuit 33 may generate the comparison signal COM, the logic level of which is determined based on whether the logic level combination of the refresh count signal RCNT<L:1> is identical to the logic level combination of the set signal MRC<L:1>. The comparison signal COM may be generated to have a first logic level when the logic level combination of the refresh count signal RCNT<L:1> is identical to the logic level combination of the set signal MRC<L:1> and to have a second logic level when the logic level combination of the refresh count signal RCNT<L:1> is different from the logic level combination of the set signal MRC<L:1>. The set signal MRC<L:1> may have a logic level combination that corresponds to the set value and may be stored in a mode register based on a mode register set (MRS). In the present embodiment, the first logic level may be set as a logic "high" level, and the second logic level may be set as a logic "low" level.

The selection output circuit 35 may generate the ECS command AECS and the internal refresh command IREF based on the comparison signal COM and the refresh command REF. The selection output circuit 35 may output the refresh command REF as the ECS command AECS when the comparison signal COM is generated to have the first logic level since the refresh count signal RCNT<L:1> and the set signal MRC<L:1> have the same logic level combination. The selection output circuit 35 may output the refresh command REF as the internal refresh command IREF when the comparison signal COM is generated to have the second logic level since the refresh count signal RCNT<L:1> and the set signal MRC<L:1> have different logic level combinations.

Figure 4:
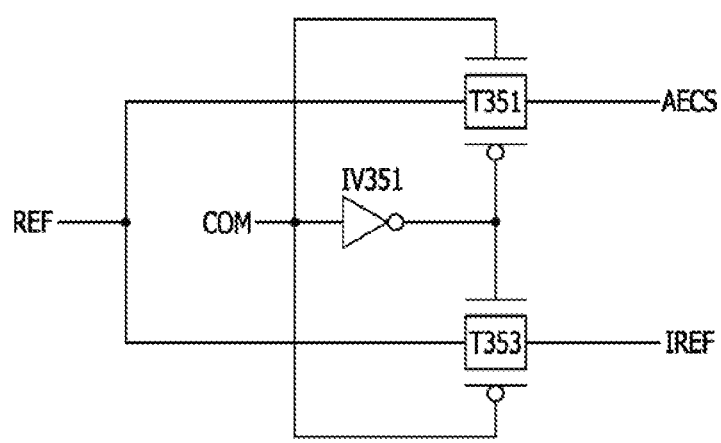
FIG. 4 is a circuit diagram, illustrating an example of a selection output circuit, included in the ECS command generation circuit of FIG. 3.

FIG. 4 is a circuit diagram, illustrating the selection output circuit 35, included in the ECS command generation circuit 223. As illustrated in FIG. 4, the selection output circuit 35 may include an inverter IV351 and transfer gates T351 and T353. The inverter IV351 may inversely buffer the comparison signal COM to output the inversely buffered signal of the comparison signal COM. When the comparison signal COM has a logic "high" level, the transfer gate T351 may be turned on to output the refresh command REF as the ECS command AECS. When the comparison signal COM has a logic "low" level, the transfer gate T351 may be turned on to output the refresh command REF as the internal refresh command IREF.

Figure 5:
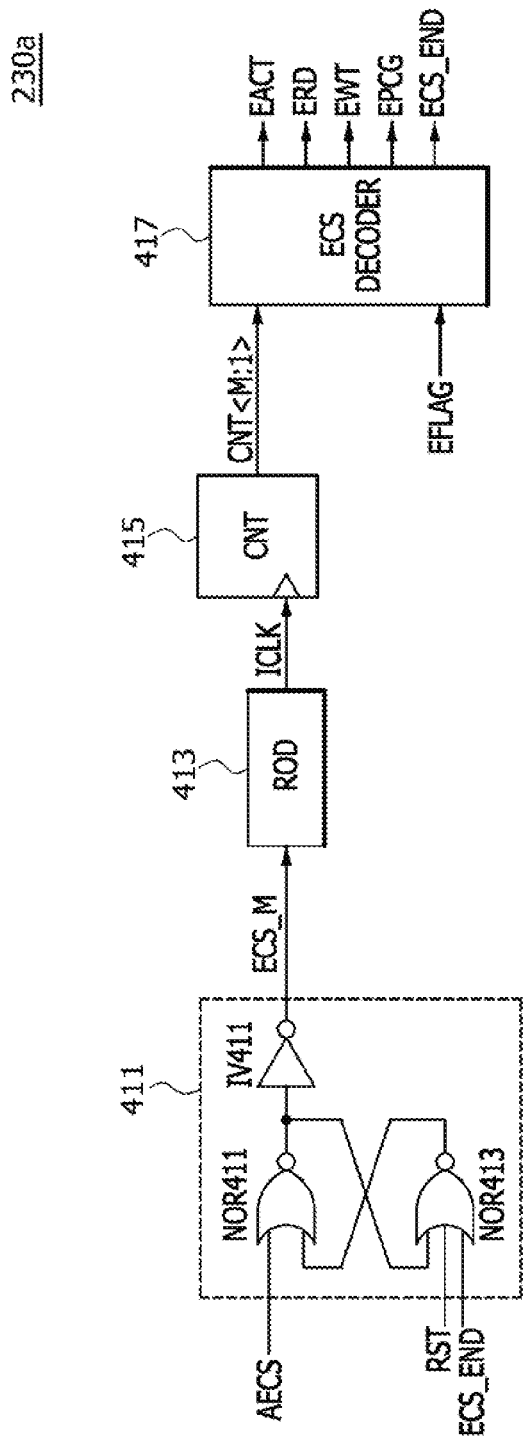
FIG. 5 illustrates an example of an ECS control circuit that is included in the semiconductor device of FIG. 2.

FIG. 5 illustrates an ECS control circuit 230a, corresponding to an example of the ECS control circuit 230, included in the semiconductor device 20a. As illustrated in FIG. 5, the ECS control circuit 230a may include an ECS mode signal generation circuit 411, an internal clock generation circuit 413, an ECS counter 415, and an ECS decoder 417.

The ECS mode signal generation circuit 411 may include NOR gates NOR411 and NOR413 and an inverter IV411. The NOR gate NOR411 may receive the ECS command AECS and an output signal of the NOR gate NOR413 to perform a logical NOR operation based on the ECS command AECS and the output signal of the NOR gate NOR413. The NOR gate NOR413 may receive a reset signal RST, the ECS end command ECS_END, and an output signal of the NOR gate NOR411 to perform a logical NOR operation based on the reset signal RST, the ECS end command ECS_END, and the output signal of the NOR gate NOR411. The inverter IV411 may inversely buffer the output signal of the NOR gate NOR411 to generate the ECS mode signal ECS_M. The ECS mode signal generation circuit 411 may generate the ECS mode signal ECS_M based on the ECS command AECS, the reset signal RST, and the ECS end command ECS_END. When the ECS command AECS is generated to have a logic "high" level, the ECS mode signal generation circuit 411 may generate the ECS mode signal ECS_M having a logic "high" level. When the reset signal RST or the ECS end command ECS_END is generated to have a logic "high" level, the ECS mode signal generation circuit 411 may change a logic level of the ECS mode signal ECS_M from a logic "high" level into a logic "low" level. The reset signal RST may be generated to have a logic "high" level for an initialization operation of the semiconductor device 20.

The internal clock generation circuit 413 may generate the internal clock signal ICLK based on the ECS mode signal ECS_M. The internal clock generation circuit 413 may generate the internal clock signal ICLK while the ECS mode signal ECS_M has a logic "high" level. When the ECS mode signal ECS_M has a logic "low" level, the internal clock generation circuit 413 may stop generation of the internal clock signal ICLK. The internal clock generation circuit 413 may include an oscillator.

The ECS counter 415 may count the internal clock signal ICLK to generate a count signal CNT<M:1>. The ECS counter 415 may be synchronized with a rising edge (or a falling edge according to the embodiments) of the internal clock signal ICLK to increase the binary number that corresponds to the logic level combination of the count signal CNT<M:1>. The number "M" of bits, included in the count signal CNT<M:1>, may be set as a natural number that is equal to or greater than two. For example, when the number "M" is set as four, the count signal CNT<4:1> may be counted up bit by bit to have logic level combinations of '0000', '0001', '0010', '0011', '0100', . . . , and '1111', in sequence, whenever a logic level of the internal clock signal ICLK changes from a logic "low" level into a logic "high" level. In the count signal CNT<4:1>, the logic level combination of '0001' means that fourth to second bits CNT<4:2> of the count signal CNT<4:1> have a logic "low" level and the first bit CNT<1> of the count signal CNT<4:1> has a logic "high" level.

The ECS decoder 417 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 417 may sequentially generate the ECS active command EACT, the ECS read command ERD, the ECS write command EWT, the ECS pre-charge command EPCG, and the ECS end command ECS_END based on a logic level combination of the count signal CNT<M:1>. For example, the ECS decoder 417 may generate the ECS active command EACT when the count signal CNT<M:1> has a logic level combination of '0011', may generate the ECS read command ERD when the count signal CNT<M:1> has a logic level combination of '0101', may generate the ECS write command EWT when the count signal CNT<M:1> has a logic level combination of '0111', may generate the ECS pre-charge command EPCG when the count signal CNT<M:1> has a logic level combination of '1001', and may generate the ECS end command ECS_END when the count signal CNT<M:1> has a logic level combination of '1011'. The ECS decoder 417 may stop the generation of the ECS write command EWT when the error flag EFLAG is generated by an error, detected from the codeword, stored in the selected memory cells.

Figure 6:
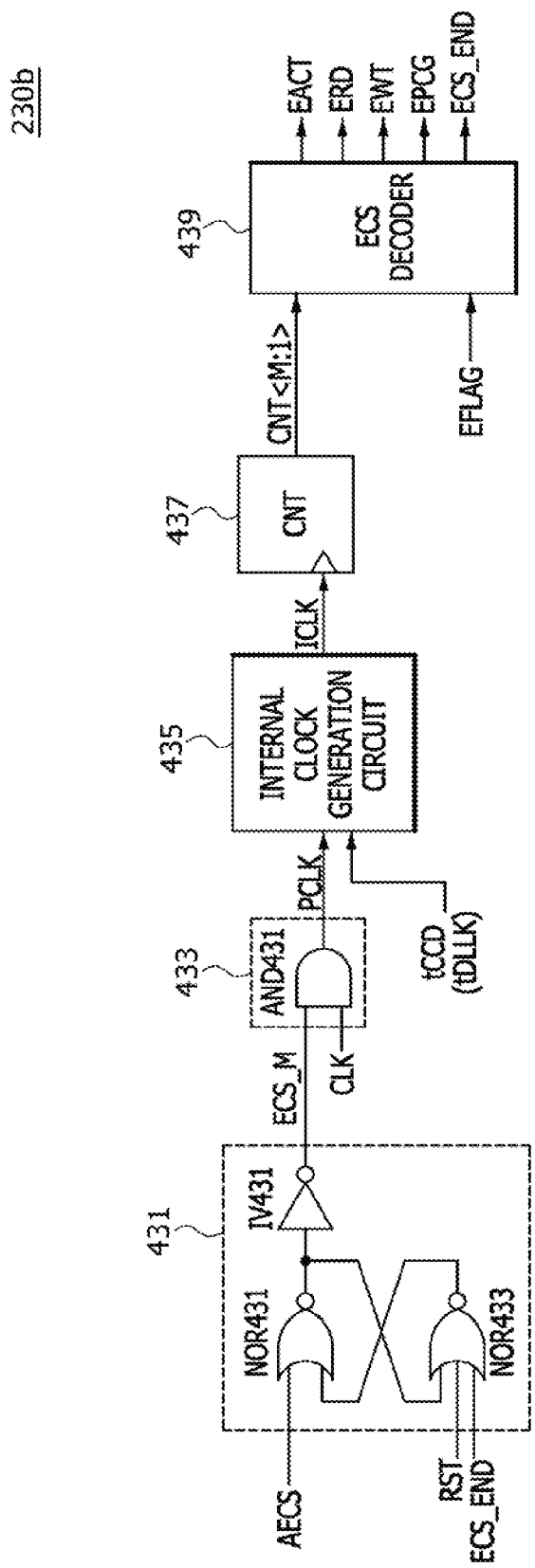
FIG. 6 illustrates another example of an ECS control circuit that is included in the semiconductor device of FIG. 2.

FIG. 6 illustrates an ECS control circuit 230b corresponding to another example of the ECS control circuit 230 that is included in the semiconductor device 20a. As illustrated in FIG. 6, the ECS control circuit 230b may include an ECS mode signal generation circuit 431, a pre-clock generation circuit 433, an internal clock generation circuit 435, an ECS counter 437, and an ECS decoder 439.

The ECS mode signal generation circuit 431 may include NOR gates NOR431 and NOR433 and an inverter IV431. The NOR gate NOR431 may receive the ECS command AECS and an output signal of the NOR gate NOR433 to perform a logical NOR operation based on the ECS command AECS and the output signal of the NOR gate NOR433. The NOR gate NOR433 may receive the reset signal RST, the ECS end command ECS_END, and an output signal of the NOR gate NOR431 to perform a logical NOR operation based on the reset signal RST, the ECS end command ECS_END, and the output signal of the NOR gate NOR431. The inverter IV431 may inversely buffer the output signal of the NOR gate NOR431 to generate the ECS mode signal ECS_M. The ECS mode signal generation circuit 431 may generate the ECS mode signal ECS_M based on the ECS command AECS, the reset signal RST, and the ECS end command ECS_END. When the ECS command AECS is generated to have a logic "high" level, the ECS mode signal generation circuit 431 may generate the ECS mode signal ECS_M having a logic "high" level. When the reset signal RST or the ECS end command ECS_END is generated to have a logic "high" level, the ECS mode signal generation circuit 431 may change a logic level of the ECS mode signal ECS_M from a logic "high" level into a logic "low" level.

The pre-clock generation circuit 433 may include an AND gate AND431. The pre-clock generation circuit 433 may perform a logical AND operation based on the ECS mode signal ECS_M and an external clock signal CLK to generate a pre-clock signal PCLK. The external clock signal CLK may be provided by the controller (10 of FIG. 1). The pre-clock generation circuit 433 may buffer the external clock signal CLK to output the buffered signal of the external clock signal CLK as the pre-clock signal PCLK while the ECS operation is performed by the ECS mode signal ECS_M having a logic "high" level. When the ECS operation is not performed by the ECS mode signal ECS_M having a logic "low" level, the pre-clock generation circuit 433 may output the pre-clock signal PCLK having a logic "low" level.

The internal clock generation circuit 435 may generate the internal clock signal ICLK based on the pre-clock signal PCLK and an operation speed flag tCCD or tDLLK. The internal clock generation circuit 435 may control a cycle of the pre-clock signal PCLK based on the speed flag tCCD or tDLLK to generate the internal clock signal ICLK. The speed flag tCCD or tDLLK may be set to be different based on a range of data rates. Referring to FIG. 7, when the data rate is within the range of 2,000 Mbps to 3,200 Mbps, the speed flag tCCD (CAS to CAS Delay period) may be set as '8' and the speed flag tDLLK (delay locked clock period) may be set as '1024'. In addition, as the data rate increases, the speed flag tCCD or tDLLK may also increase.

When the data rate increases, the internal clock generation circuit 435 may generate the internal clock signal ICLK by increasing the cycle of the pre-clock signal PCLK since the cycle of the external clock signal CLK is reduced by the speed flag tCCD or tDLLK. When the data rate decrease, the internal clock generation circuit 435 may generate the internal clock signal ICLK by reducing the cycle of the pre-clock signal PCLK since the cycle of the external clock signal CLK increases by the speed flag tCCD or tDLLK. Because the internal clock generation circuit 435 controls a cycle of the pre-clock signal PCLK to generate the internal clock signal ICLK even though the data rate varies, the internal clock generation circuit 435 may generate the internal clock signal ICLK having a constant cycle regardless of the variation in data rates. The internal clock generation circuit 435 may include a ring oscillator.

The ECS counter 437 may count the internal clock signal ICLK to generate the count signal CNT<M:1>. The ECS counter 437 may be synchronized with a rising edge (or a falling edge based on the embodiments) of the internal clock signal ICLK to increase a binary number that corresponds to the logic level combination of the count signal CNT<M:1>.

The ECS decoder 439 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 439 may sequentially generate the ECS active command EACT, the ECS read command ERD, the ECS write command EWT, the ECS pre-charge command EPCG, and the ECS end command ECS_END based on a logic level combination of the count signal CNT<M:1>.

Figure 8:
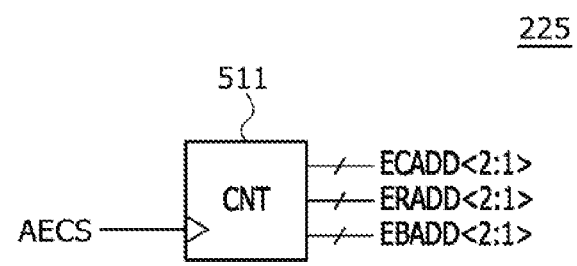
FIG. 8 illustrates an example of an address counter that is included in the semiconductor device of FIG. 2.

FIG. 8 illustrates the address counter 225 that is included in the semiconductor device 20a. As illustrated in FIG. 8, the address counter 225 may include a counter 511 that counts the ECS command AECS to generate the ECS column address ECADD<2:1>, the ECS row address ERADD<2:1>, and the ECS bank address EBADD<2:1>. The counter 511 may sequentially increase the logic level combination of the ECS column address ECADD<2:1>, the logic level combination of the ECS row address ERADD<2:1>, and the logic level combination of the ECS bank address EBADD<2:1>, whenever the ECS command AECS is inputted to the counter 511. For example, whenever the ECS command AECS is inputted to the counter 511, the counter 511 may sequentially increase the logic level combination of the ECS column address ECADD<2:1> in order ('00', '01', '10', and '11'), may sequentially increase the logic level combination of the ECS row address ERADD<2:1> in order ('00', '01', '10', and '11') after sequentially increasing the logic level combination of the ECS column address ECADD<2:1>, and may sequentially increase the logic level combination of the ECS bank address EBADD<2:1> in order ('00' and '01') after sequentially increasing the logic level combination of the ECS row address ERADD<2:1>. That is, the row path, next to a certain row path, may be selected after all of the column paths that are connected to memory cells in the certain row path are sequentially selected, and the memory bank, next to a certain memory bank, may be selected after all of the row paths that are included in the certain memory bank are sequentially selected. The present embodiment describes a case in which the ECS operations are performed for only the memory cells included in the memory bank 250. In such a case, the row path may mean at least one word line, which is selected by the ECS row address ERADD, among a plurality of word lines included in the memory bank 250, and the column path may mean at least one bit line (or at least one sense amplifier), which is selected by the ECS column address ECADD, among a plurality of bit lines (or a plurality of sense amplifiers), coupled to memory cells arrayed in one row path.

Figure 9:
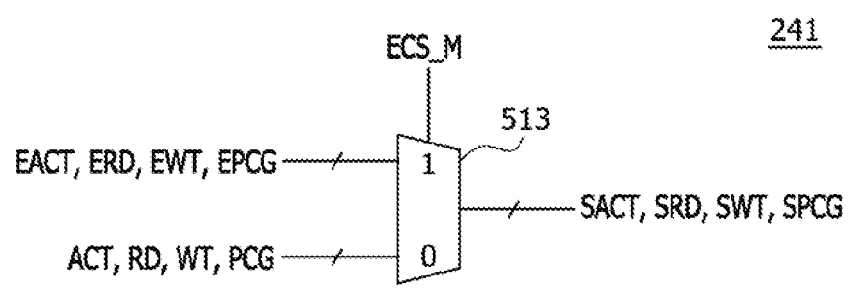
FIG. 9 illustrates an example of a selection command generation circuit that is included in the semiconductor device of FIG. 2.

FIG. 9 illustrates the selection command generation circuit 241 that is included in the semiconductor device 20a. As illustrated in FIG. 9, the selection command generation circuit 241 may include a command selector 513 that generates the selection active command SACT, the selection read command SRD, the selection write command SWT, and the selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. During the ECS operation, the command selector 513 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG. The command selector 513 may select and output the active command ACT, the read command RD, the write command WT, and the pre-charge command PCG as the selection active command SACT, the selection read command SRD, the selection write command SWT, and the selection pre-charge command SPCG during a period when the ECS operation is not performed.

Figure 10:
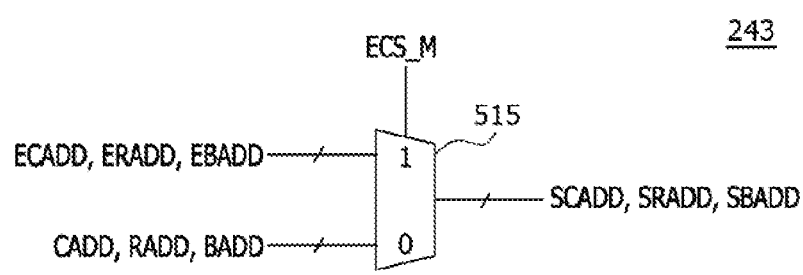
FIG. 10 illustrates an example of a selection address generation circuit that is included in the semiconductor device of FIG. 2.

FIG. 10 illustrates the selection address generation circuit 243 that is included in the semiconductor device 20a. As illustrated in FIG. 10, the selection address generation circuit 243 may include an address selector 515 that generates the selection column address SCADD, the selection row address SRADD, and the selection bank address SBADD from the ECS column address ECADD, the ECS row address ERADD, the ECS bank address EBADD, the column address CADD, the row address RADD, and the bank address BADD based on the ECS mode signal ECS_M. During the ECS operation, the address selector 515 may select and output the ECS column address ECADD, the ECS row address ERADD, and the ECS bank address EBADD as the selection column address SCADD, the selection row address SRADD, and the selection bank address SBADD. The address selector 515 may select and output the column address CADD, the row address RADD, and the bank address BADD as the selection column address SCADD, the selection row address SRADD, and the selection bank address SBADD during a period when the ECS operation is not performed.

Figure 11:
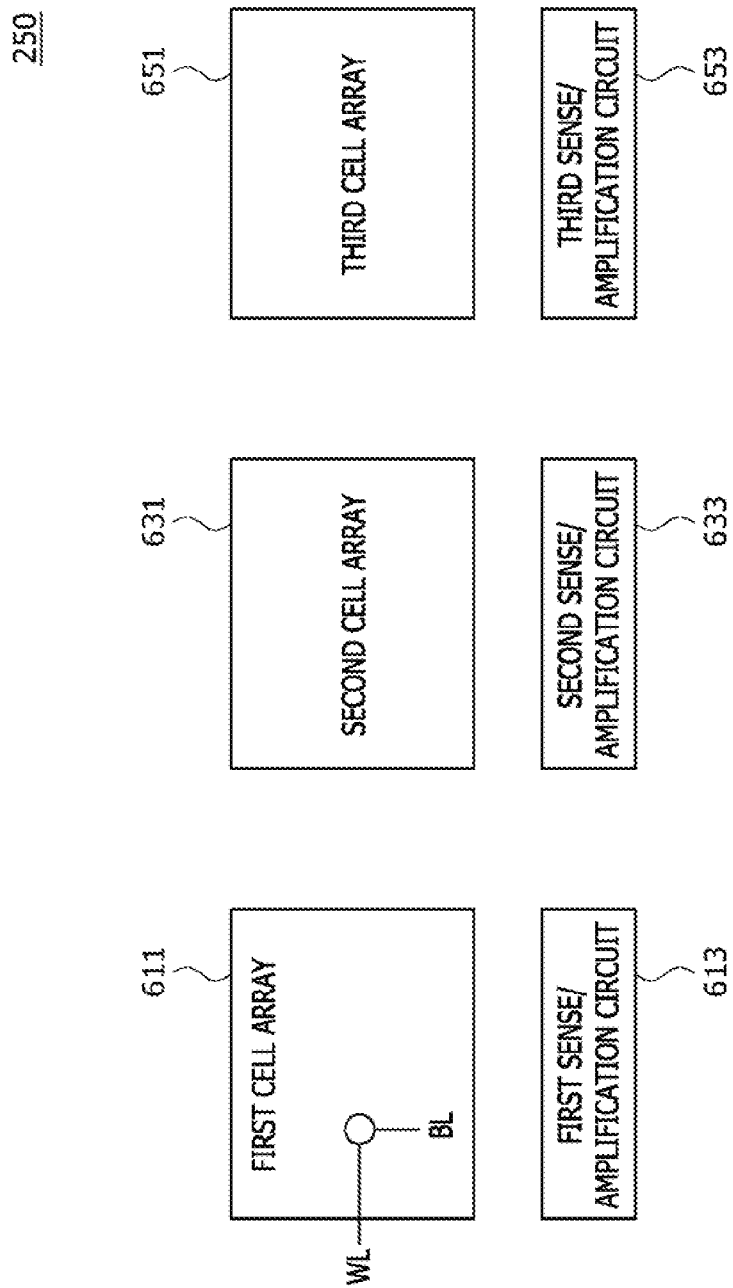
FIG. 11 is a block diagram, illustrating an example of a memory bank, included in the semiconductor device of FIG. 2.

FIG. 11 is a block diagram, illustrating a configuration of the memory bank 250, included in the semiconductor device 20a. As illustrated in FIG. 11, the memory bank 250 may include a first cell array 611, a first sense/amplification circuit 613, a second cell array 631, a second sense/amplification circuit 633, a third cell array 651, and a third sense/amplification circuit 653. Each of the first, second, and third cell arrays 611, 631, and 651 may include a plurality of memory cells that are connected to word lines WL and bit lines BL. The number of memory cells that are included in each of the first, second, and third cell arrays 611, 631, and 651 may be set to be different according to the embodiments. Data and parities may be stored in each of the first, second, and third cell arrays 611, 631, and 651. Alternatively, the data or the parities may be stored in each of the first, second, and third cell arrays 611, 631, and 651. At least one the first, second, and third cell arrays 611, 631, and 651 may be used as a redundancy cell array during a repair operation to repair erroneous memory cells with redundant memory cells in the redundancy cell array. The first sense/amplification circuit 613 may include sense amplifiers, connected to the bit lines, included in the first cell array 611. The second sense/amplification circuit 633 may include sense amplifiers, connected to the bit lines, included in the second cell array 631. The third sense/amplification circuit 653 may include sense amplifiers, connected to the bit lines, included in the third cell array 651.

Figure 12:
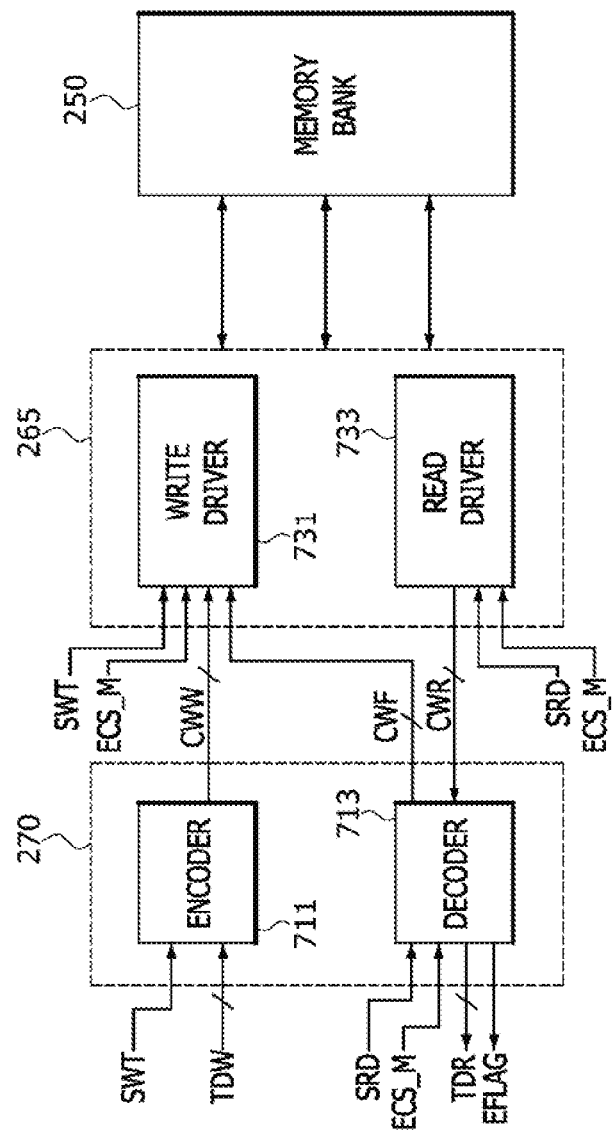
FIG. 12 is a block diagram, illustrating a memory bank, an input/output (I/O) control circuit, and an error correction circuit, included in the semiconductor device of FIG. 2.

FIG. 12 is a block diagram, illustrating the memory bank 250, the I/O control circuit 265, and the error correction circuit 270, included in the semiconductor device 20a. The error correction circuit 270 may include an encoder 711 and a decoder 713. The encoder 711 may generate a write codeword CWW based on the selection write command SWT and write transmission data TDW. The decoder 713 may generate read transmission data TDR, the error flag EFLAG, and a corrected codeword CWF based on the selection read command SRD, the ECS mode signal ECS_M, and a read codeword CWR. The I/O control circuit 265 may include a write driver 731 and a read driver 733. The write driver 731 may store the write codeword CWW or the corrected codeword CWF into the memory bank 250 based on the selection write command SWT and the ECS mode signal ECS_M. The read driver 733 may transmit the read codeword CWR, outputted from the memory bank 250, to the decoder 713. The write operation, the read operation, and the ECS operation of the semiconductor device 20a, having the aforementioned configuration, will be described hereinafter.

When the write operation is performed, the encoder 711 may encode the write transmission data TDW to generate the write codeword CWW and to transmit the write codeword CWW to the write driver 731. The write transmission data TDW may correspond to the transmission data (TD of FIG. 2) that is outputted from the data buffer (280 of FIG. 2) during the write operation. The encoder 711 is may generate parity from the write transmission data TDW using a Hamming code and may generate the write codeword CWW that includes the write transmission data TDW and parity. The write codeword CWW may correspond to a codeword that is used during the write operation. The write driver 731 may store the write codeword CWW into the memory bank 250.

When the read operation is performed, the read driver 733 may transmit the read codeword CWR that includes the data and parity, stored in the memory bank 250, to the decoder 713. The decoder 713 may correct an error of the read codeword CWR to output corrected data as the read transmission data TDR.

When the ECS operation is performed, the read driver 733 may transmit the read codeword CWR, including the data and parity, stored in the memory bank 250, to the decoder 713. The read codeword CWR may correspond to a codeword that is used during the read operation. The decoder 713 may correct an error of the read codeword CWR to generate the corrected codeword CWF, including corrected data and parity, and to output the corrected codeword CWF to the write driver 731. The write driver 731 may store the corrected codeword CWF in the memory bank 250.

Figure 13:
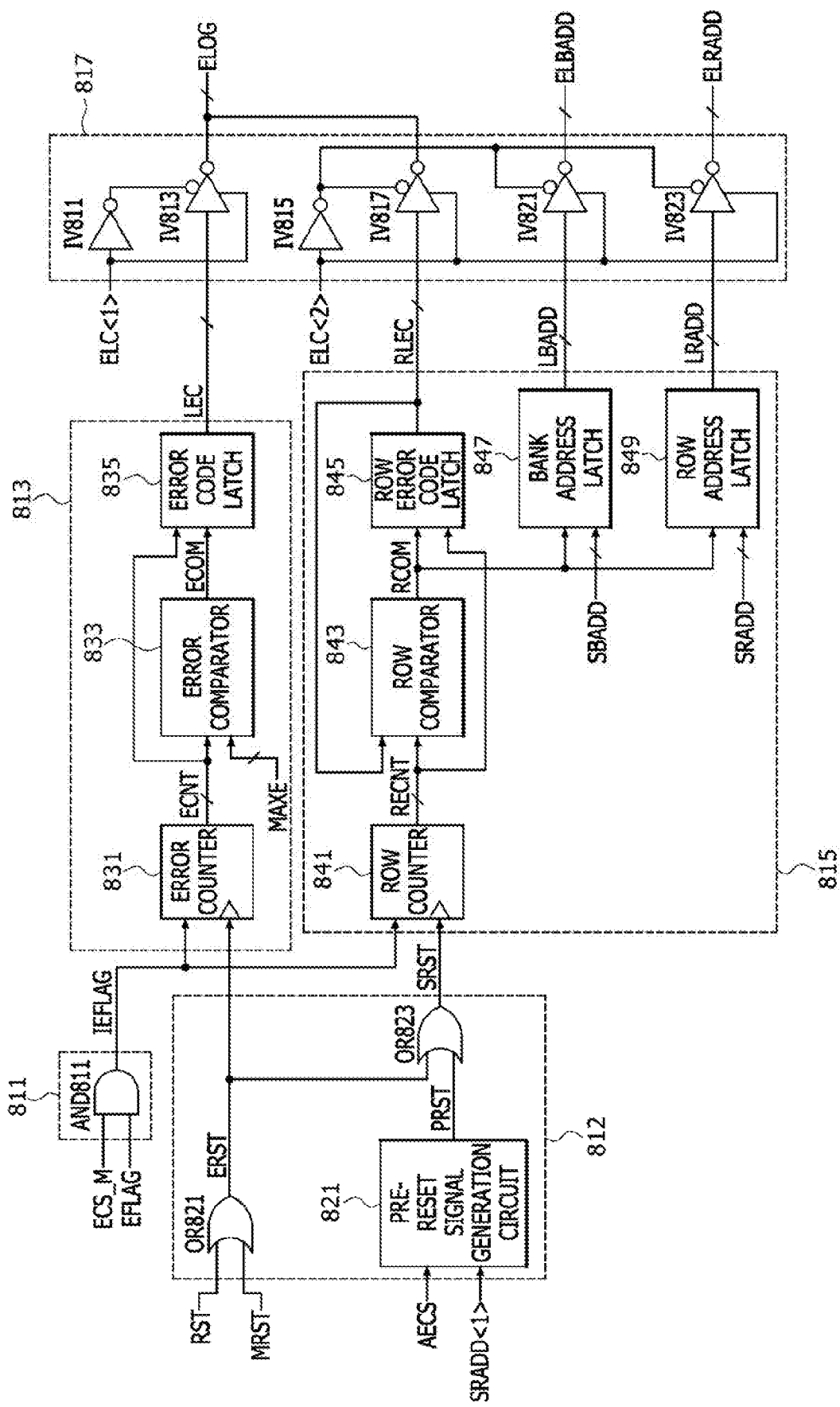
FIG. 13 illustrates an example of an error log storage circuit that is included in the semiconductor device of FIG. 2.

FIG. 13 illustrates a configuration of the error log storage circuit 290 included in the semiconductor device 20a. As illustrated in FIG. 13, the error log storage circuit 290 may include an internal error flag generation circuit 811, a selection reset signal generation circuit 812, an error log control circuit 813, a row error log control circuit 815, and an error log output circuit 817.

The internal error flag generation circuit 811 may include an AND gate AND811. The AND gate AND811 may perform a logical AND operation of the ECS mode signal ECS_M and the error flag EFLAG to generate an internal error flag IEFLAG. The internal error flag generation circuit 811 may generate the internal error flag IEFLAG having a logic "high" level when the error flag EFLAG, having a logic "high" level, is generated by an error, detected from a codeword, stored in the memory cells, selected while the ECS mode signal ECS_M has a logic "high" level to perform the ECS operation.

The selection reset signal generation circuit 812 may include OR gates OR821 and OR823 and a pre-reset signal generation circuit 821. The OR gate OR821 may perform a logical OR operation of the reset signal RST and a mode register reset signal MRST to generate an error reset signal ERST. The OR gate OR821 may generate the error reset signal ERST, having a logic "high" level, when the reset signal RST or the mode register reset signal MRST is generated to have a logic "high" level. The mode register reset signal MRST may be generated to have a logic "high" level to reset a mode register (not shown). The pre-reset signal generation circuit 821 may generate a pre-reset signal PRST based on the ECS command AECS and a first bit SRADD<1> of the selection row address SRADD. The pre-reset signal generation circuit 821 may generate the pre-reset signal PRST, having a logic "high" level, when the ECS operations are performed for memory cells that are connected to a row path next to a certain row path after the ECS operations are performed for memory cells that are connected to the certain row path that is included in the memory bank 250. The OR gate OR823 may perform a logical OR operation of the error reset signal ERST and the pre-reset signal PRST to generate a selection reset signal SRST. The OR gate OR823 may generate the selection reset signal SRST having a logic "high" level when the error reset signal ERST or the pre-reset signal PRST is generate to have a logic "high" level.

The selection reset signal generation circuit 812 may generate the error reset signal ERST, having a logic "high" level, and the selection reset signal SRST, having a logic "high" level, when the reset signal RST or the mode register reset signal MRST is generated to have a logic "high" level after the ECS operations are performed for all of memory cells that are included in the memory bank 250. The selection reset signal generation circuit 812 may generate the selection reset signal SRST, having a logic "high" level, when the ECS operations are performed for memory cells that are connected to a row path next to a certain row path after the ECS operations are performed for all of memory cells that are connected to the certain row path that is included in the memory bank 250.

The error log control circuit 813 may include an error counter 831, an error comparator 833, and an error code latch 835. The error counter 831 may count the internal error flag IEFLAG to generate an error count signal ECNT. The error counter 831 may count up the error count signal ECNT whenever the internal error flag IEFLAG, having a logic "high" level, is generated by an error that is detected from a codeword, stored in memory cells, for which the ECS operation is performed. The error counter 831 may initialize the error count signal ECNT when the error rest signal ERST is generated to have a logic "high" level. The error comparator 833 may compare the error count signal ECNT with a maximum error value MAXE to generate an error comparison signal ECOM. The error comparator 833 may generate the error comparison signal ECOM, having a first logic level, when the error count signal ECNT increases to have a value that is equal to or greater than the maximum error value MAXE. The error comparator 833 may generate the error comparison signal ECOM, having a second logic level, when the error count signal ECNT has a value that is less than the maximum error value MAXE. The error code latch 835 may latch the error count signal ECNT based on the error comparison signal ECOM to generate a latched error code LEC. The error code latch 835 may latch the error count signal ECNT to output the latched signal of the error count signal ECNT as the latched error code LEC when the error comparison signal ECOM, having the first logic level, is generated by the error count signal ECNT having a value that is equal to or greater than the maximum error value MAXE. The maximum error value MAXE may be stored is in a mode register by a mode register set.

After the ECS operations are performed for all of memory cells in the memory bank 250, the error log control circuit 813 may latch the error count signal ECNT to output the latched signal of the error count signal ECNT as the latched error code LEC when the number of errors that are detected during the ECS operations is equal to or greater than the maximum error value MAXE.

The row error log control circuit 815 may include a row counter 841, a row comparator 843, a row error code latch 845, a bank address latch 847, and a row address latch 849. The row counter 841 may count the internal error flag IEFLAG to generate a row error count signal RECNT. When the ECS operations are performed for all of memory cells included in one row path, the row counter 841 may increase the row error count signal RECNT whenever the internal error flag IEFLAG is generated to have a logic "high" level by an error detected from a codeword stored in memory cells. The row counter 841 may initialize the row error count signal RECNT if the selection rest signal SRST is generated to have a logic "high" level when the ECS operations are performed for a row path next to a certain row path after the ECS operations are performed for memory cells that are included in the certain row path. The row comparator 843 may compare the row error count signal RECNT with a row latch error code RLEC to generate a row comparison signal RCOM. The row comparator 843 may generate the row comparison signal RCOM, having the first logic level, when the row error count signal RECNT increases to have a value that is equal to or greater than the row latch error code RLEC. The row comparator 843 may generate the row comparison signal RCOM, having the second logic level, when the row error count signal RECNT has a value that is less than the row latch error code RLEC. The row error code latch 845 may latch the row error count signal RECNT based on the row comparison signal RCOM to generate the row latch error code RLEC. The row error code latch 845 may latch the row error count signal RECNT to output the latched signal of the row error count signal RECNT as the row latch error code RLEC when the row comparison signal RCOM, having the first logic level, is generated by the row error count signal RECNT, having a value that is equal to or greater than the row latch error code RLEC. The bank address latch 847 may generate a latched bank address LBADD from the selection bank address SBADD based on the row comparison signal RCOM. When the row comparison signal RCOM has the first logic level, the bank address latch 847 may latch the selection bank address SBADD and may output the latched address of the selection bank address SBADD as the latched bank address LBADD. The row address latch 849 may generate a latched row address LRADD from the selection row address SRADD based on the row comparison signal RCOM. When the row comparison signal RCOM has the first logic level, the row address latch 849 may latch the selection row address SRADD and may output the latched address of the selection row address SRADD as the latched row address LRADD.

The row error log control circuit 815 may compare the numbers of the errors of all of the row paths with each other to output the information on the maximum number of the errors as the row latch error code RLEC and to output the information on the row path with the maximum number of the errors as the latched bank address LBADD and the latched row address LRADD.

The error log output circuit 817 may include inverters IV811, IV813, IV815, IV817, IV821, and IV823. The inverter IV811 may inversely buffer a first bit signal ELC<1> of the error log command ELC to output the inversely buffered signal of the first bit signal ELC<1> of the error log command ELC. When the first bit signal ELC<1> of the error log command ELC has a logic "high" level, the inverter IV813 may inversely buffer the latched error code LEC to output the inversely buffered signal of the latched error code LEC as the error log signal ELOG. The inverter IV815 may inversely buffer a second bit signal ELC<2> of the error log command ELC to output the inversely buffered signal of the second bit signal ELC<2> of the error log command ELC. When the second bit signal ELC<2> of the error log command ELC has a logic "high" level, the inverter IV817 may inversely buffer the row latch error code RLEC to output the inversely buffered signal of the row latch error code RLEC as the error log signal ELOG. When the second bit signal ELC<2> of the error log command ELC has a logic "high" level, the inverter IV821 may inversely buffer the latched bank address LBADD to output the inversely buffered signal of the latched bank address LBADD as the error log bank address ELBADD. When the second bit signal ELC<2> of the error log command ELC has a logic "high" level, the inverter IV823 may inversely buffer the latched row address LRADD to output the inversely buffered signal of the latched row address LRADD as the error log row address ELRADD.

Figure 14:
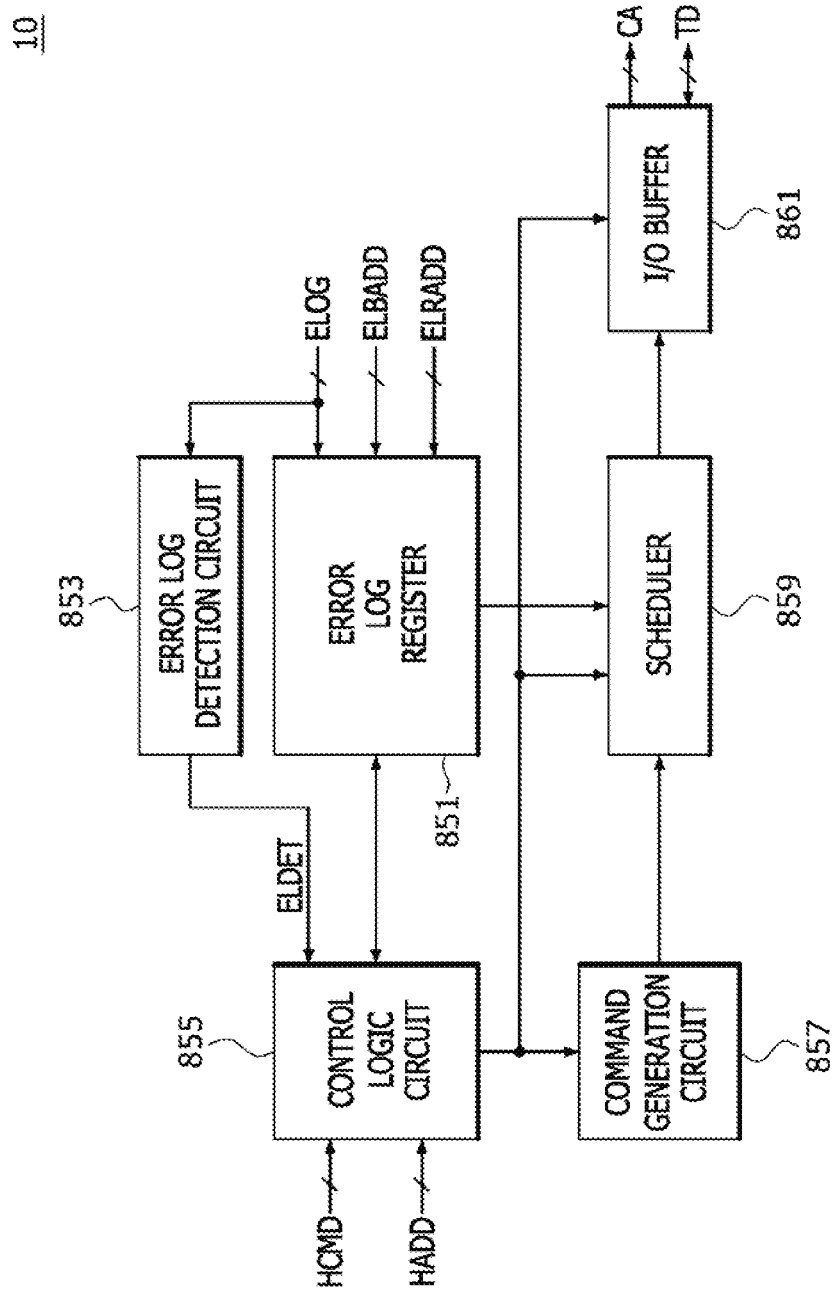
FIG. 14 is a block diagram, illustrating an example of a controller, included in the semiconductor system of FIG. 1.

FIG. 14 is a block diagram, illustrating a configuration of the controller 10, included in the semiconductor system 1 of FIG. 1. As illustrated in FIG. 14, the controller 10 may include an error log register 851, an error log detection circuit 853, a control logic circuit 855, a command generation circuit 857, a scheduler 859, and an I/O buffer 861.

The error log register 851 may store the error log signal ELOG, the error log bank address ELBADD, and the error log row address ELRADD, which are outputted from the semiconductor device 20.

The error log detection circuit 853 may generate an error log detection signal ELDET based on the error log signal ELOG. The error log detection circuit 853 may generate the error log detection signal ELDET that is activated when the number of memory cells that are storing an erroneous codeword, verified by the error log signal ELOG, is equal to or greater than a predetermined error limitation value. The predetermined error limitation value may be set to be different according to the embodiments.

The control logic circuit 855 may control the command generation circuit 857, the scheduler 859, and the I/O buffer 861 based on a host command HCMD and a host address HADD outputted from a host (1100 of FIG. 16) to perform the refresh operation, the active operation, the read operation, the write operation, or the ECS operation of the semiconductor device 20.

When the error log detection signal ELDET is activated, the control logic circuit 855 may control the command generation circuit 857, the scheduler 859, and the I/O buffer 861 such that the internal operations for the memory cells, included in a row path, selected by the error log bank address ELBADD and the error log row address ELRADD, might not be performed in the semiconductor device 20.

The I/O buffer 861 may transmit the command/address signal CA and the transmission data TD to the semiconductor device 20 during the write operation. The I/O buffer 861 may receive the transmission data TD from the semiconductor device 20 during the read operation.

Figure 15:
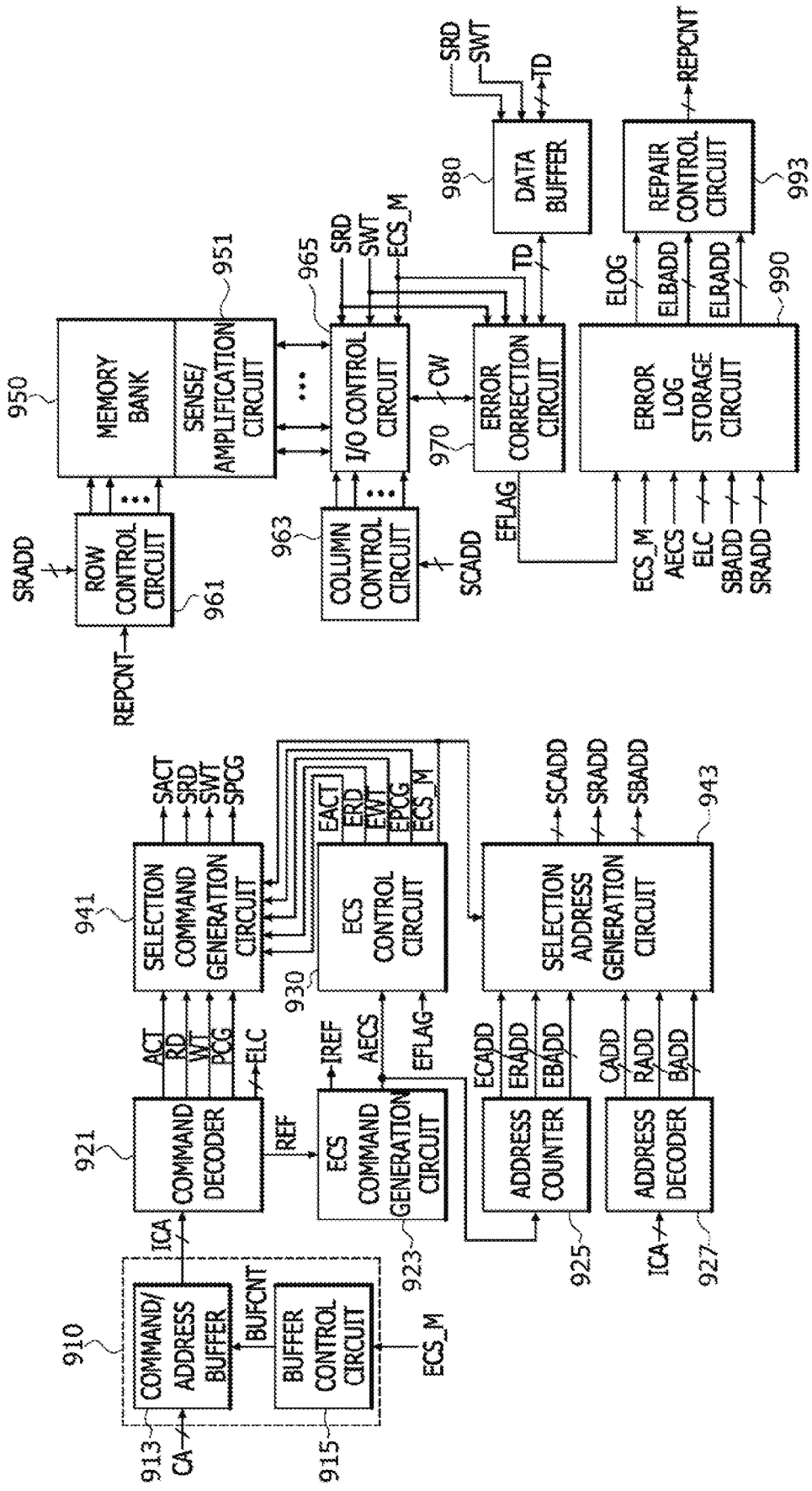
FIG. 15 is a block diagram, illustrating another example of a semiconductor device, included in the semiconductor system of FIG. 1.

FIG. 15 is a block diagram, illustrating a configuration of a semiconductor device 20b, corresponding to another example of the semiconductor device 20, included in the semiconductor system 1 of FIG. 1. As illustrated in FIG. 15, the semiconductor device 20b may include a command/address receiving circuit 910, a command decoder 921, an ECS command generation circuit 923, an address counter 925, an address decoder 927, the ECS control circuit 930, a selection command generation circuit 941, a selection address generation circuit 943, the memory bank 950, a sense/amplification circuit 951, a row control circuit 961, a column control circuit 963, an I/O control circuit 965, an error correction circuit 970, a data buffer 980, an error log storage circuit 990, and a repair control circuit 993.

The command/address receiving circuit 910 may include a command/address buffer 913 and a buffer control circuit 915. The command/address buffer 913 may buffer a command/address signal CA received through the first transmission line (L11 of FIG. 1) to generate an internal command/address signal ICA. When an ECS operation is performed, the buffer control circuit 915 may generate a buffer control signal BUFCNT based on an ECS mode signal ECS_M. When the ECS operation is performed, the command/address buffer 913 may receive the buffer control signal BUFCNT, generated by the buffer control circuit 915, and may buffer the command/address signal CA to stop an operation to generate the internal command/address signal ICA.

The command decoder 921 may decode the internal command/address signal ICA to generate a refresh command REF, an active command ACT, a read command RD, a write command WT, a pre-charge command PCG, and an error log command ELC.

The ECS command generation circuit 923 may generate an ECS command AECS and an internal refresh command IREF based on the refresh command REF. The ECS command generation circuit 923 may generate the ECS command AECS whenever the refresh command REF is generated a predetermined number of times. When the ECS command AECS is not generated, the ECS command generation circuit 923 may generate the internal refresh command IREF based on the refresh command REF.

The address counter 925 may generate an ECS column address ECADD, an ECS row address ERADD, and an ECS bank address EBADD based on the ECS command AECS. The address counter 925 may count the ECS command AECS to sequentially increase the binary number corresponding to the logic level combination of bits included in the ECS column address ECADD, to sequentially increase the binary number corresponding to the logic level combination of bits included in the ECS row address ERADD, and to sequentially increase the binary number corresponding to the logic level combination of bits included in the ECS bank address EBADD.

The address decoder 927 may decode the internal command/address signal ICA to generate a column address CADD, a row address RADD, and a bank address BADD. The address decoder 927 may decode the internal command/address signal ICA to generate the column address CADD, the row address RADD, and the bank address BADD that are used for the internal operations such as the active operation, the read operation, and the write operation.

The ECS control circuit 930 may generate the ECS mode signal ECS_M based on the ECS command AECS. The ECS mode signal ECS_M may be generated while the ECS operation is performed. The ECS control circuit 930 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 930 may count an internal clock signal (ICLK of FIG. 5) based on the error flag EFLAG to sequentially generate the ECS active command EACT, the ECS read command ERD, the ECS write command EWT, the ECS pre-charge command EPCG, and the ECS end command ECS_END while the ECS operation is performed. When no error is detected from a codeword, outputted from the memory cells, during an ECS error correction operation without generating the error flag EFLAG, the ECS control circuit 930 might not generate the ECS write command EWT.

The selection command generation circuit 941 may select and output the ECS active command EACT, the ECS read command ERD, the ECS write command EWT, and the ECS pre-charge command EPCG as a selection active command SACT, a selection read command SRD, a selection write command SWT, and a selection pre-charge command SPCG while the ECS operation is performed. The selection command generation circuit 941 may select and output the active command ACT, the read command RD, the write command WT, and the pre-charge command PCG as the selection active command SACT, the selection read command SRD, the selection write command SWT, and the selection pre-charge command SPCG while the ECS operation is not performed.

The selection address generation circuit 943 may select and output the ECS column address ECADD, the ECS row address ERADD, and the ECS bank address EBADD as a selection column address SCADD, a selection row address SRADD, and a selection bank address SBADD while the ECS operation is performed. The selection address generation circuit 943 may select and output the column address CADD, the row address RADD, and the bank address BADD as the selection column address SCADD, the selection row address SRADD, and the selection bank address SBADD while the ECS operation is not performed.

The memory bank 950 may include a plurality of memory cells, and each of the memory cells may be coupled to any one of the word lines and any one of the bit lines. One of the word lines that is connected to the memory cells, included in the memory bank 950, may be selected by the selection row address SRADD. At least one of the bit lines that is connected to the memory cells, included in the memory bank 950, may be selected by the selection column address SCADD. At least one of the memory cells may be accessed by selecting one of the word lines and at least one of the bit lines.

The sense/amplification circuit 951 may include a plurality of sense amplifiers (not shown). The sense amplifiers that are included in the sense/amplification circuit 951 may be connected to the memory cells, included in the memory bank 950, and may sense and amplify levels of data signals that are loaded on the bit lines.

The row control circuit 961 may select one of the word lines that are coupled to the memory cells, included in the memory bank 250, as a row path based on the selection row address SRADD. The row control circuit 961 may perform the active operation for loading a codeword, stored in the memory cells, connected to a word line, selected by the selection row address SRADD, on the bit lines such that the sense/amplification circuit 951 senses and amplifies data signals of the codeword. The row control circuit 961 may perform a repair operation for a row path with the maximum number of errors based on a repair control signal REPCNT. The row control circuit 961 may perform the repair operation using a method that replaces the row path with the maximum number of errors with a row path connected to redundant memory cells. Because the probability is very high that most of the memory cells that are connected to the row path with the maximum number of errors are failed memory cells, the row control circuit 961 may replace the row path with the maximum number of errors with a row path connected to redundant memory cells using a row repair operation.

The column control circuit 963 may control the I/O control circuit 965 such that the codeword is inputted to or outputted from the sense amplifiers, selected by the selection column address SCADD, among the plurality of sense amplifiers, coupled to the memory cells in a row path selected by the selection row address SRADD. The column control circuit 963 may control the I/O control circuit 965 such that the read operation and the write operation are performed for the memory cells that are coupled to the sense amplifiers, selected by the selection column address SCADD, among the plurality of memory cells, included in a memory bank performing the active operation. In some other embodiments, the column control circuit 963 may perform a column repair operation that is executed using a way that replaces a column path, connected to a failed memory cell, with a redundant column path that is connected to a redundant memory cell based on the repair control signal REPCNT.

The I/O control circuit 965 may be coupled between the sense/amplification circuit 951 and the error correction circuit 970 to control input or output of a codeword based on the selection read command SRD, the selection write command SWT, and the ECS mode signal ECS_M. The I/O control circuit 965 may output a codeword CW, including data and parity, outputted from the memory bank 950, to the error correction circuit 970 during the read operation or the ECS read operation. The I/O control circuit 965 may output the codeword CW, received from the error correction circuit 970, to the memory bank 950 during the write operation or the ECS write operation.

The error correction circuit 970 may receive the codeword CW from the I/O control circuit 965 or may output the codeword CW to the I/O control circuit 965 based on the selection read command SRD, the selection write command SWT, and the ECS mode signal ECS_M. The error correction circuit 970 may receive the transmission data TD from the data buffer 980 or may output the transmission data TD to the data buffer 980 based on the selection read command SRD, the selection write command SWT, and the ECS mode signal ECS_M. The error correction circuit 970 may generate the error flag EFLAG based on the codeword CW. When the read operation is performed, the error correction circuit 970 may receive the codeword CW from the I/O control circuit 965 and may decode the codeword CW to generate the error flag EFLAG and to output data, included in the codeword CW, corrected by the error correction circuit 970, as the transmission data TD through the data buffer 980 if an error is detected from the codeword CW. When the write operation is performed, the error correction circuit 970 may encode the transmission data TD received from the data buffer 980 to generate the codeword CW, including data and parity, and may transmit the codeword CW to the I/O control circuit 965 to store the codeword CW into the memory bank 950. When the ECS read operation is performed, the error correction circuit 970 may receive the codeword CW from the I/O control circuit 965 and may decode the codeword CW to generate the error flag EFLAG and the codeword CW, corrected by the error correction circuit 970, if an error is detected from the codeword CW. The error correction circuit 970 may generate the corrected codeword CW during the ECS read operation, and the error correction circuit 970 may transmit the corrected codeword CW to the I/O control circuit 965 to store the corrected codeword CW into the memory bank 950 during the ECS write operation.

The data buffer 980 may receive the transmission data TD from the error correction circuit 970 or may output the transmission data TD to the error correction circuit 970 based on the selection read command SRD and the selection write command SWT. The data buffer 980 may receive the transmission data TD from the controller (10 of FIG. 1) or may output the transmission data TD to the controller (10 of FIG. 1) based on the selection read command SRD and the selection write command SWT. When the write operation is performed, the data buffer 980 may transmit the transmission data TD, received through the second transmission line (L13 of FIG. 1), to the error correction circuit 970. When the read operation is performed, the data buffer 980 may transmit the transmission data TD, received from the error correction circuit 970, to the controller 10 through the second transmission line L13.

The error log storage circuit 990 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. When the ECS operations are performed for all of the memory cells included in the memory bank 950, the error log storage circuit 990 may output information on the number of errors detected based on the error flag EFLAG as the error log signal ELOG. When the ECS operations are performed for all of the memory cells that are included in the memory bank 950, the error log storage circuit 990 may compare the numbers of the errors of all of the row paths with each other based on the error flag EFLAG, the selection row address SRADD, and the selection bank address SBADD to output information on the maximum number of the errors as the error log signal ELOG and to output information on the row path with the maximum number of the errors as the error log row address ELRADD and the error log bank address ELBADD. The error log storage circuit 990 may transmit the error log signal ELOG to the controller 10 through the second transmission line L13. The error log storage circuit 990 may transmit the error log row address ELRADD and the error log bank address ELBADD to the controller 10 through the third transmission line L15.

The repair control circuit 993 may receive the error log signal ELOG, the error log row address ELRADD, and the error log bank address ELBADD to generate the repair control signal REPCNT for executing the repair operation for a row path with the maximum number of errors. The repair control signal REPCNT may include information (e.g., the error log row address ELRADD and the error log bank address ELBADD) on a row path that necessitates the repair operation.

According to the embodiments, an ECS operation may be performed based on a refresh command. Thus, the ECS operation for correcting an error of a codeword, stored in memory cells, to restore the corrected codeword into the memory cells, may be performed without using any other command provided by an external device.

In addition, according to the embodiments, reception of a command and an address is interrupted during the ECS operation. Thus, it may be possible to reduce power consumption of a command/address receiving circuit during the ECS operation and to prevent malfunction due to a command/address signal from occurring during the ECS operation.

Moreover, according to the embodiments, commands for the ECS operation may be generated using an internal clock signal or an external clock signal. Thus, the ECS operation may be performed at a constant speed regardless of variation of a data rate.

Furthermore, according to the embodiments, a repair operation may be performed based on information on the maximum number of errors that are detected from a row path and information on a row path with the maximum number of errors. Thus, the repair operation for a row path with a lot of failed memory cells may be more readily performed.

Figure 16:
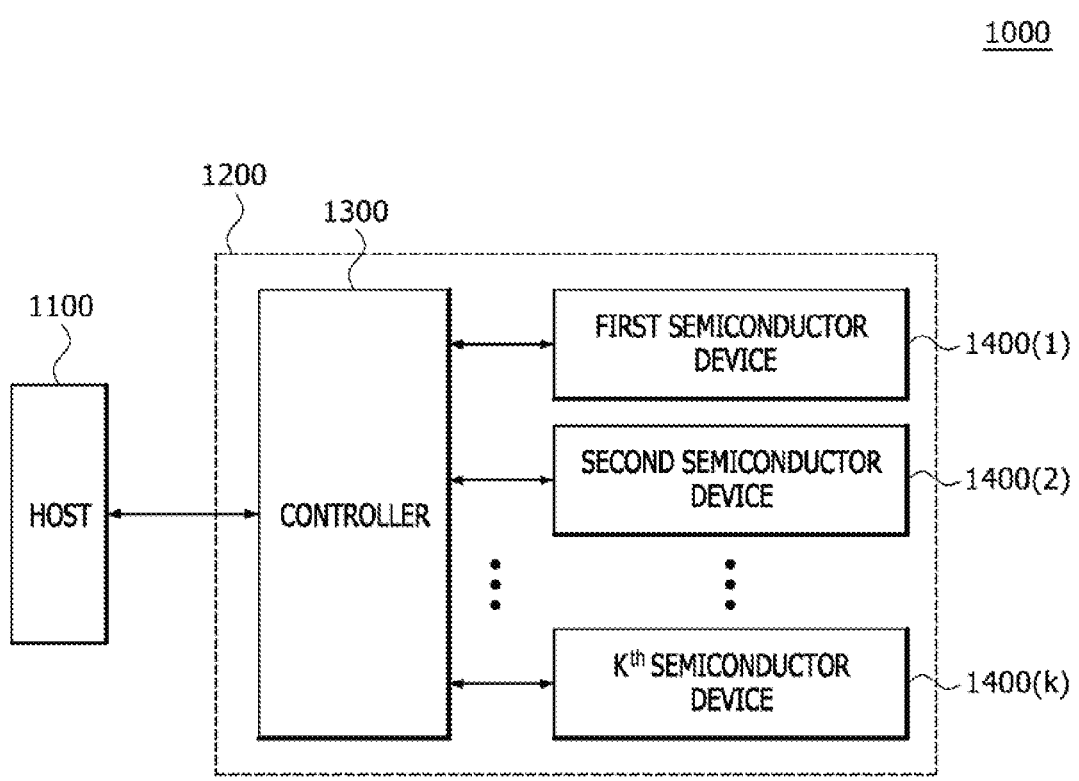
FIG. 16 is a block diagram, illustrating a configuration of an electronic system, according to an embodiment of the present disclosure.

FIG. 16 is a block diagram, illustrating a configuration of an electronic system 1000, according to an embodiment of the present disclosure. As illustrated in FIG. 16, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform a refresh operation, a read operation, a write operation, or an ECS operation. Each of the semiconductor devices 1400(K:1) may perform the ECS operation based on a refresh command to correct an error of a codeword stored in memory cells included in the semiconductor device and to restore the corrected codeword into the memory cells. Each of the semiconductor devices 1400(K:1) may store information on the number of errors detected by the ECS operations for all of the memory cells, information on the maximum number of errors of a row path, and information on a row path with the maximum number of errors. Each of the semiconductor devices 1400(K:1) may perform the repair operation based on the information stored during the ECS operation. The controller 1300 may receive the information stored during the ECS operation from the semiconductor devices 1400(K:1) to restrict the internal operations for the memory cells connected to a row path with the maximum number of errors.

The controller 1300 may include the controller 10 that is illustrated in FIGS. 1 and 14. Each of the semiconductor devices 1400(K:1) may include the semiconductor device 20a that is illustrated in FIG. 2 or the semiconductor device 20b that is illustrated in FIG. 15. In some embodiments, the semiconductor device 20a or the semiconductor device 20b may include any one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
   an error check and scrub (ECS) command generation circuit configured to generate an ECS command based on a refresh command; and
   an ECS control circuit, during an ECS operation, configured to generate an ECS mode signal that is activated based on the ECS command and configured to generate an ECS active command, an ECS read command, and an ECS write command to perform the ECS operation, wherein the ECS active command is generated to perform an ECS active operation to load a codeword, stored in at least one memory cell, connected to a row path that is selected by a row address, on at least one bit line to sense and amplify the codeword.

2. The semiconductor device of claim 1, wherein the ECS command generation circuit generates the ECS command whenever the refresh command is generated a predetermined number of times.

3. The semiconductor device of claim 2, wherein the ECS command generation circuit includes:
   a comparison circuit configured to compare a refresh count signal, generated by counting the predetermined number of refresh commands that are generated with a set signal to generate a comparison signal; and
   a selection output circuit configured to output the refresh command as an internal refresh command to perform the ECS operation or a refresh operation based on the comparison signal.

4. The semiconductor device of claim 1, wherein the ECS control circuit includes:
   an ECS mode signal generation circuit configured to generate the ECS mode signal that is activated based on the ECS command; and
   an ECS decoder configured to decode a count signal, generated by counting an internal clock signal, to generate the ECS active command, the ECS read command, and the ECS write command while the ECS mode signal is activated.

5. The semiconductor device of claim 1, wherein the ECS read command is generated to perform an ECS read operation to transmit a codeword of a column path, selected by a column address, to an error correction circuit.

6. The semiconductor device of claim 1, further comprising an error correction circuit configured to:
   receive a codeword, including data and parity, which is outputted from memory cells based on an ECS active operation and an ECS read operation, performed based on the ECS active command and the ECS read command,
   detect an error of the codeword to generate an error flag, and
   correct the error of the codeword to generate a corrected codeword.

7. The semiconductor device of claim 6, wherein the ECS write command is generated to perform an ECS write operation to transmit the corrected codeword to a column path that is selected by a column address.

8. The semiconductor device of claim 1, wherein the ECS write command is not generated when no error is detected from a codeword outputted by an ECS read operation that is performed by the ECS read command.

9. The semiconductor device of claim 1, further comprising an error log storage circuit configured to store information as an error log signal and an error log address based on an error flag, the information including:
   a number of errors detected by the ECS operation,
   a maximum number of errors of a row path, and
   the row path with the maximum number of errors.

10. The semiconductor device of claim 9, wherein the error log storage circuit outputs the error log signal and the error log address through at least one semiconductor pin.

11. The semiconductor device of claim 9, wherein the error log storage circuit includes:
    an error log control circuit configured to generate a latched error code, including information regarding the number of errors that are detected based on the error flag when ECS operations are sequentially performed for all of memory cells;
    a row error log control circuit configured to compare the numbers of errors of the row paths with each other to generate a row latch error code, including information regarding the maximum number of errors of one of the row paths, and configured to generate a latched bank address and a latched row address, including information regarding the row path with the maximum number of errors; and
    an error log output circuit configured to output the latched error code or the row latch error code as the error log signal based on an error log command and configured to output the latched bank address and the latched row address as an error log bank address and an error log row address based on the error log command.

12. The semiconductor device of claim 9, further comprising a repair control circuit configured to generate a repair control signal to replace memory cells that are connected to a row path that corresponds to the error log address with redundant memory cells.

13. The semiconductor device of claim 1, further comprising a command/address receiving circuit configured to buffer a command/address signal to generate an internal command/address signal,
    wherein the command/address receiving circuit is deactivated when the ECS operation is performed.

14. A semiconductor device comprising:
    a command/address receiving circuit configured to buffer a command/address signal to generate an internal command/address signal;
    a command decoder configured to decode the internal command/address signal to generate a refresh command;
    an error check and scrub (ECS) command generation circuit configured to generate an ECS command based on the refresh command; and
    an ECS control circuit configured to generate an ECS mode signal that is activated based on the ECS command during an ECS operation,
    wherein the command/address receiving circuit is deactivated when the ECS operation is performed.

15. The semiconductor device of claim 14, wherein the ECS command generation circuit generates the ECS command whenever the refresh command is generated a predetermined number of times.

16. The semiconductor device of claim 14, wherein the ECS control circuit includes:
- an ECS mode signal generation circuit configured to generate the ECS mode signal that is activated based on the ECS command; and
- an ECS decoder configured to decode a count signal generated by counting an internal clock signal to generate an ECS active command, an ECS read command, and an ECS write command while the ECS mode signal is activated.

17. The semiconductor device of claim 16, further comprising an error correction circuit configured to
- receive a codeword, including data and parity, which is outputted from memory cells based on an ECS active operation and an ECS read operation, performed based on the ECS active command and the ECS read command,
- detect an error of the codeword to generate an error flag, and
- correct the error of the codeword to generate a corrected codeword.

18. The semiconductor device of claim 16, wherein the ECS write command is not generated when no error is detected from a codeword outputted by an ECS read operation that is performed by the ECS read command.

19. The semiconductor device of claim 14, further comprising an error log storage circuit configured to, during the ECS operation, store information as an error log signal and an error log address based on an error flag, the information including:
- a number of memory cells storing an erroneous codeword,
- a maximum number of memory cells storing the erroneous codeword in a row path, and
- the row path with the maximum number of memory cells storing the erroneous codeword.

20. A semiconductor system comprising:
- a controller configured to output a command and an address and configured to receive an error log signal and an error log address; and
- a semiconductor device configured to:
- generate an error check and scrub (ECS) command based on a refresh command that is generated by decoding the command,
- detect an error of a codeword, including data and parity, stored in memory cells, to generate an error flag based on the ECS command during an ECS operation,
- store information regarding a maximum number of errors of a row path as the error log signal based on the error flag,
- store information regarding the row path with the maximum number of errors as the error log address, and
- output the error log signal and the error log address.

21. The semiconductor system of claim 20, wherein the controller receives the error log signal and the error log address to control the semiconductor device such that an internal operation of memory cells, connected to the row path with the maximum number of errors, is not performed.

* * * * *